(12) United States Patent
Dadvand et al.

(10) Patent No.: US 12,068,221 B2
(45) Date of Patent: Aug. 20, 2024

(54) PLATING FOR THERMAL MANAGEMENT

(71) Applicant: Texas Instruments Incorporated, Dallas, TX (US)

(72) Inventors: Nazila Dadvand, Richardson, TX (US); Christopher Daniel Manack, Flower Mound, TX (US); Salvatore Frank Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 156 days.

(21) Appl. No.: 16/985,103

(22) Filed: Aug. 4, 2020

(65) Prior Publication Data
US 2020/0365483 A1 Nov. 19, 2020

Related U.S. Application Data

(63) Continuation of application No. 16/193,089, filed on Nov. 16, 2018, now Pat. No. 10,734,304.

(51) Int. Cl.
*H01L 23/373* (2006.01)
*C23C 14/16* (2006.01)
(Continued)

(52) U.S. Cl.
CPC ........ *H01L 23/3736* (2013.01); *C23C 14/165* (2013.01); *C23C 18/38* (2013.01); *C25D 3/38* (2013.01); *C25D 3/46* (2013.01); *H01L 21/2855* (2013.01); *H01L 21/288* (2013.01); *H01L 21/76873* (2013.01); *H01L 21/78* (2013.01)

(58) Field of Classification Search
CPC ........... H01L 21/3736; H01L 21/76873; H01L 21/78–786; C23C 14/165; C25D 7/123; C25D 3/46; C25D 3/38; H05K 3/423; H05K 3/424
See application file for complete search history.

(56) References Cited

U.S. PATENT DOCUMENTS 5,858,074 A  1/1999 Cole et al.
5,928,790 A  7/1999 Bokisa
(Continued)

FOREIGN PATENT DOCUMENTS

CN  1777978 A  5/2006
CN  107039337 A  8/2017

OTHER PUBLICATIONS

Torok, "Nanoscale characterization of thin immersion silver coatings on copper substrates," NASF Surface Technology White Papers 79 (8), 1-11 (May 2015), The National Association for Surface Finishing, 1800 M Street, Suite 400 S, Washington, DC 20036.
(Continued)

*Primary Examiner* — Jay C Chang
*Assistant Examiner* — Mikka Liu
(74) *Attorney, Agent, or Firm* — Dawn Jos; Frank D. Cimino

(57) ABSTRACT

Described examples include a process that includes forming a diffusion barrier layer on a backside of a semiconductor wafer. The process also includes forming a seed copper layer on the diffusion barrier layer. The process also includes forming a copper layer on the seed copper layer. The process also includes immersion plating a silver layer on the copper layer.

11 Claims, 26 Drawing Sheets

(51) Int. Cl.
*C23C 18/38* (2006.01)
*C25D 3/38* (2006.01)
*C25D 3/46* (2006.01)
*H01L 21/285* (2006.01)
*H01L 21/288* (2006.01)
*H01L 21/768* (2006.01)
*H01L 21/78* (2006.01)

(56) References Cited

U.S. PATENT DOCUMENTS

| | | | | |
|---|---|---|---|---|
| 6,022,808 | A * | 2/2000 | Nogami | H01L 21/76877 |
| | | | | 216/17 |
| 6,162,658 | A * | 12/2000 | Green | H01L 31/022425 |
| | | | | 438/57 |
| 6,429,037 | B1 * | 8/2002 | Wenham | H01L 31/02168 |
| | | | | 438/57 |
| 8,212,331 | B1 * | 7/2012 | Kar-Roy | H01L 21/6835 |
| | | | | 438/622 |
| 9,060,430 | B1 * | 6/2015 | Huemoeller | H05K 1/0219 |
| 10,103,123 | B2 | 10/2018 | Rogalli et al. | |
| 2004/0084769 | A1 | 5/2004 | Sugaya et al. | |
| 2006/0292847 | A1 | 12/2006 | Schetty, III | |
| 2008/0121343 | A1 * | 5/2008 | Cohen | C23C 18/1651 |
| | | | | 156/701 |
| 2008/0268267 | A1 * | 10/2008 | Barbetta | H05K 3/244 |
| | | | | 428/458 |
| 2009/0162557 | A1 * | 6/2009 | Lu | H01L 24/83 |
| | | | | 427/383.3 |
| 2009/0236129 | A1 * | 9/2009 | Schueller | H05K 3/244 |
| | | | | 174/257 |
| 2010/0029045 | A1 | 2/2010 | Ramanathan et al. | |
| 2010/0044884 | A1 * | 2/2010 | Zbrzezny | H01L 23/49811 |
| | | | | 257/779 |
| 2011/0186340 | A1 * | 8/2011 | Kuramoto | H01L 24/83 |
| | | | | 174/260 |
| 2014/0008234 | A1 | 1/2014 | Wei et al. | |
| 2014/0061915 | A1 * | 3/2014 | Collins | H01L 25/0657 |
| | | | | 257/751 |
| 2015/0179458 | A1 | 6/2015 | Mayer et al. | |
| 2015/0200181 | A1 * | 7/2015 | Haga | H01L 24/32 |
| | | | | 438/127 |
| 2016/0379954 | A1 * | 12/2016 | Cahill | H01L 24/97 |
| | | | | 257/659 |
| 2017/0236801 | A1 | 8/2017 | Rogalli et al. | |
| 2017/0271278 | A1 * | 9/2017 | Liu | H01L 24/16 |
| 2018/0019179 | A1 | 1/2018 | Kim | |
| 2019/0067164 | A1 * | 2/2019 | Noma | H01L 21/288 |

OTHER PUBLICATIONS

Materion, "Surface Coating of Copper Alloy Strip for Electrical Connector Applications" https://materion.com/-/media/files/alloy/tech-briefs/at0017-0311---tech-briefs---surface-coating-of-copper-alloy-strip.pdf (2011) Materion Brush Performance Alloys, 6070 Parkland Boulevard, Mayfield Heights, OH 4414 USA.

Mihelcic, "Spectroscopical and Electrochemical Characterisation of a (3-Mercaptopropyl)trimethoxysilane—Based Protective Coating on Aluminium Alloy 2024," Croat. Chem. Acta 2017, 90(2), 169-175 Published online: Jul. 27, 2017 DOI: 10.5562/cca3161 Croatian Chemical Society, Horvatovac 102a Zagreb, HR-10000 Croatia.

Texas Instruments, "LMR36015 4.2-V to 60-V, 1.5—A Synchronous Step-Down Converter in HotRodTM Package," LMR36015 SNVSB49—Apr. 2018, http://www.ti.com/lit/ds/symlink/lmr36015.pdf Texas Instruments Inc., 12500 TI Blvd., Dallas, TX 75243.

Charyk, "Optimizing Immersion Silver Chemistries for Copper," https://www.technic.com/sites/default/files/resources/Technic%20Optimizing%20IM%20Ag%2008%20Expo-APEX%201.pdf (2008) Technic Inc., 47 Molter Street, Cranston, Rhode Island 02910.

Patent Cooperation Treaty, PCT/US 2019/060951, mailed Feb. 13, 2020, 2 pages.

Chinese Office Action mailed Jul. 3, 2023.

* cited by examiner

PLATING FOR THERMAL MANAGEMENT

This application is a continuation of U.S. patent application Ser. No. 16/193,089, filed Nov. 16, 2018, the contents of which are herein incorporated by reference in its entirety.

TECHNICAL FIELD

This disclosure relates generally to thermal management, and, in particular, examples to plating for thermal management.

BACKGROUND

In electronic packaging, thermal management is an important aspect of packaging design and it considers the issues associated with degradation of a device at high temperatures. Thermal management is becoming more important with the continuous trends for compact and more highly integrated systems having smaller features and higher currents. Conduction is one of the methods of heat transfer from a package or device in which the heat is transferred through a solid medium. The selection of materials used for the device and the substrate influence the ability of the device to conduct the generated heat away.

To rapidly transfer heat, heat-sinks such as copper, aluminum, or copper and aluminum alloys can be used. Copper is a better electrical and thermal conductor than aluminum. However, copper oxidizes. The formation of oxide on copper reduces its thermal conductivity. In addition, long term storage of the device after backside electroplating with copper can reduce the plated copper thickness due to corrosion. Copper oxide also has weak adhesion to copper. If the copper oxide separates, it can expose the copper underneath the oxide to air and form an additional oxide layer. Applying a thin layer of tin on copper protects the copper surface from corrosion and allows long storage of the device prior to installation. However, there are disadvantages related to the use of tin. Immersion tin chemistry contains a thiourea which is carcinogenic. Tin plating can create whiskers that present contamination and shorting problems. Tin does not work well with multiple reflow/assembly processes. Tin can aggressively attack solder masks. Tin forms an intermetallic with copper over time that results in the loss of pure tin, which results in degradation of solder performance. The first reflow exposure will dramatically reduce the pure tin thickness and the resulting deposit stress could result in tin whiskers. This is a naturally occurring characteristic of tin in direct contact with copper.

SUMMARY

In accordance with an example, a process includes forming a diffusion barrier layer on a backside of a semiconductor wafer. The process also includes forming a seed copper layer on the diffusion barrier layer. The process also includes forming a copper layer on the seed copper layer. The process also includes immersion plating a silver layer on the copper layer.

DETAILED DESCRIPTION

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

The term "on" may include structures that have intervening components between a first component and the component that the first component is "on." The terms "encapsulated and encapsulation" are used. As used herein, a semiconductor die can be encapsulated with mold compound by covering at least portions of the semiconductor die and a substrate, such as a lead frame, the semiconductor die is mounted to, with mold compound. There can be portions of the substrate or the semiconductor die, such as external terminals that are formed from portions of the lead frame, that are not covered with the mold compound and yet the package is still described as "encapsulated" and is described as being formed by "encapsulation", even when some portions are not covered with mold compound.

Figure 1:
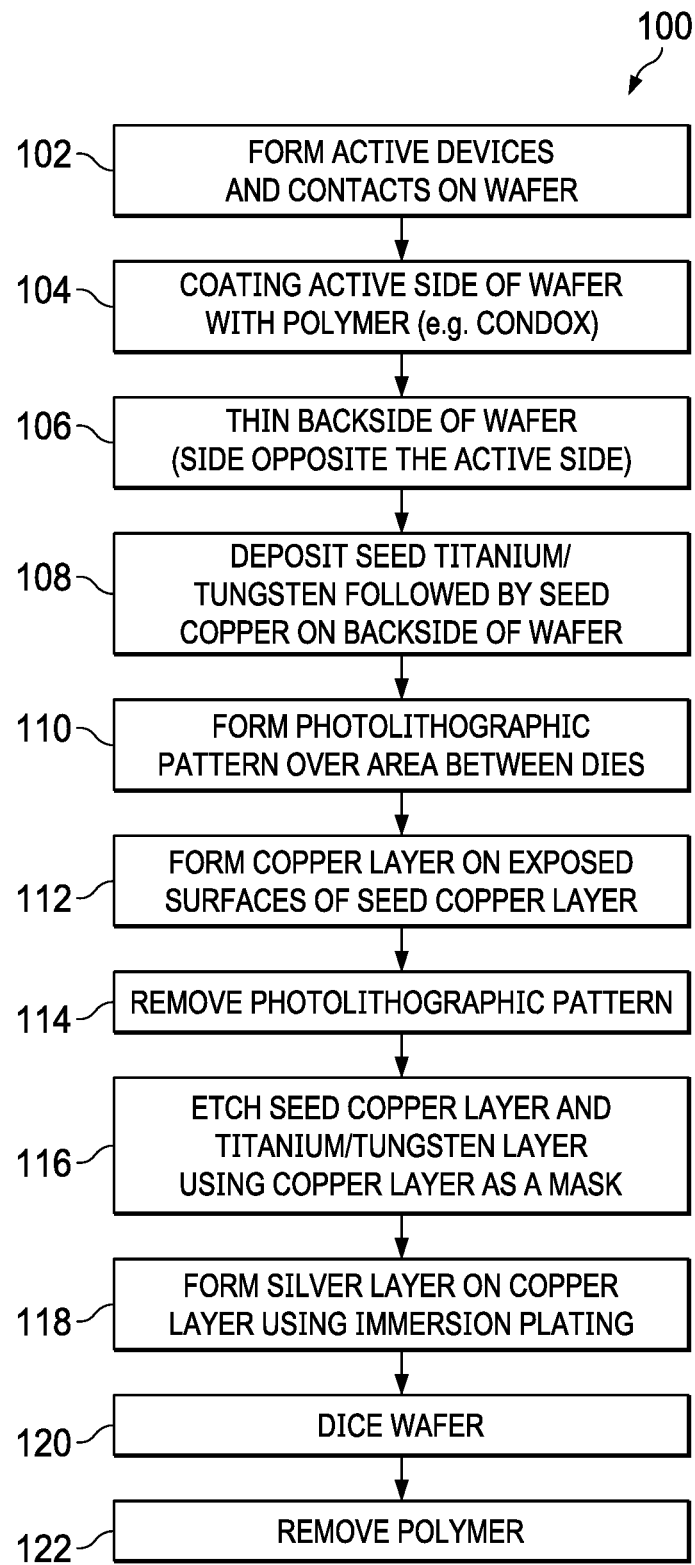
FIG. 1 is a process flow diagram of an example process.
Figure 2A:
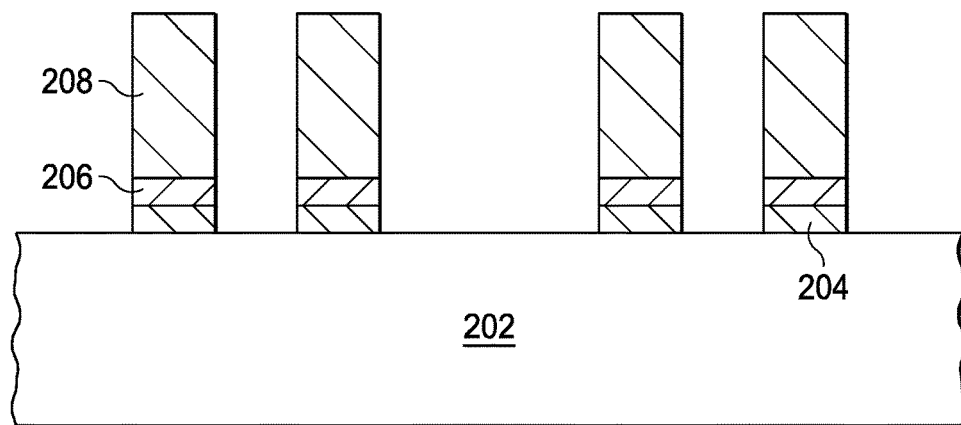
FIGS. 2A-K (collectively "FIG. 2") are schematic diagrams of the process of FIG. 1.
Figure 2B:
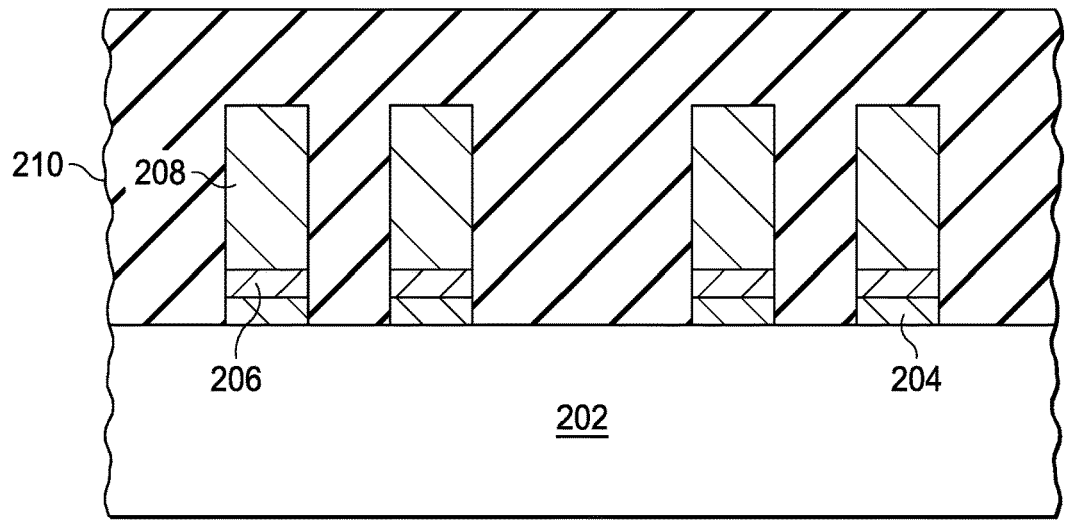

FIG. 1 is a process flow diagram of an example process 100 illustrated in FIGS. 2A-K. Step 102 is providing a semiconductor wafer 202 (FIG. 2A) having active components (not shown) and contacts, as shown in FIG. 2A as pillars including titanium-tungsten layer (TiW) 204, seed copper layer 206 and plated copper layer 208. A "semiconductor wafer" is a thin, usually circular slice of semiconductor material such as silicon, gallium arsenide, silicon germanium, III-V and 11-IV compound semiconductor materials. A "seed layer" is a layer deposited to promote preferential growth of a subsequent layer. In this case, copper seed layer 206 provides the nucleation sites for formation of copper layer 208 by, for example, electroless plating. Step 104 is covering the active side of the semiconductor wafer (i.e., the side with active devices and contact pillars) with a protective polymer 210 (FIG. 2B), such as CONDOX, which is commercially available from DISCO Corporation of Japan. The "active side" of a semiconductor wafer is the side where active components such as transistors and diodes are formed.

Figure 2C:
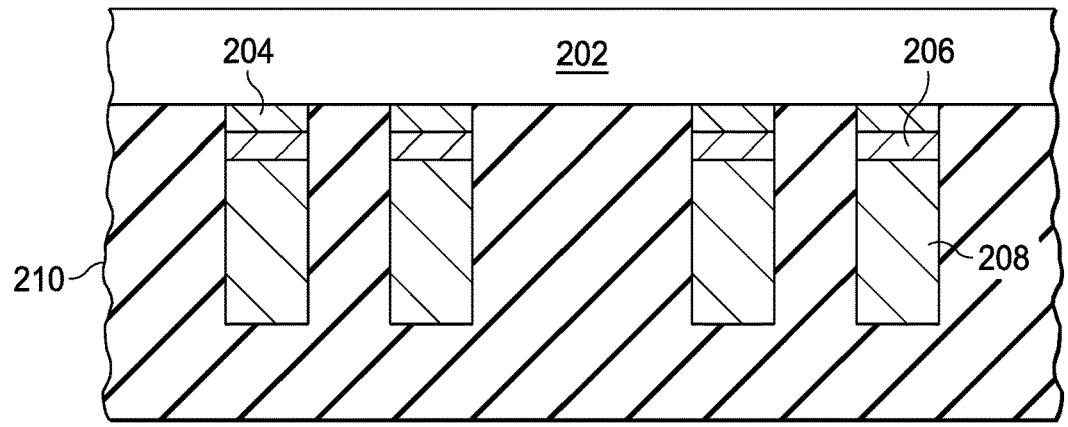
Figure 2D:
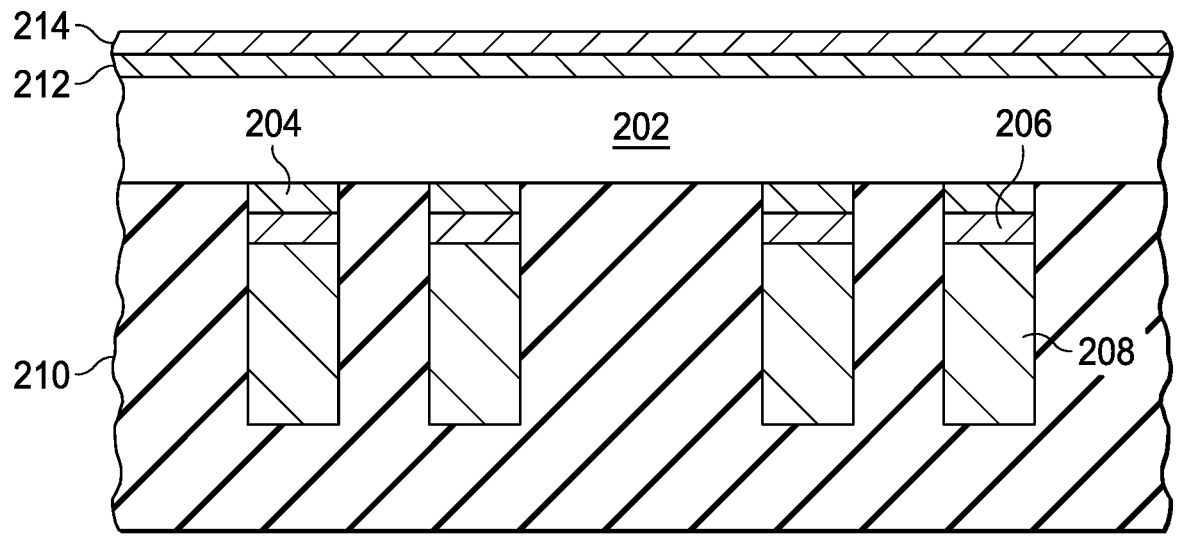
Figure 2E:
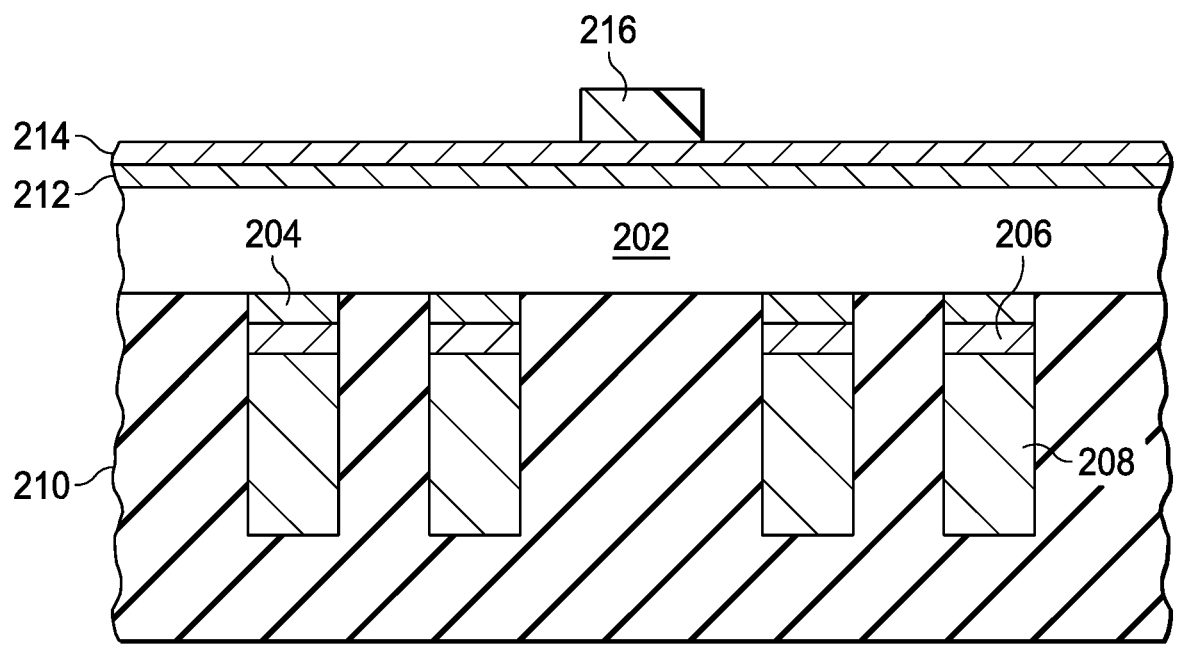
Figure 2F:
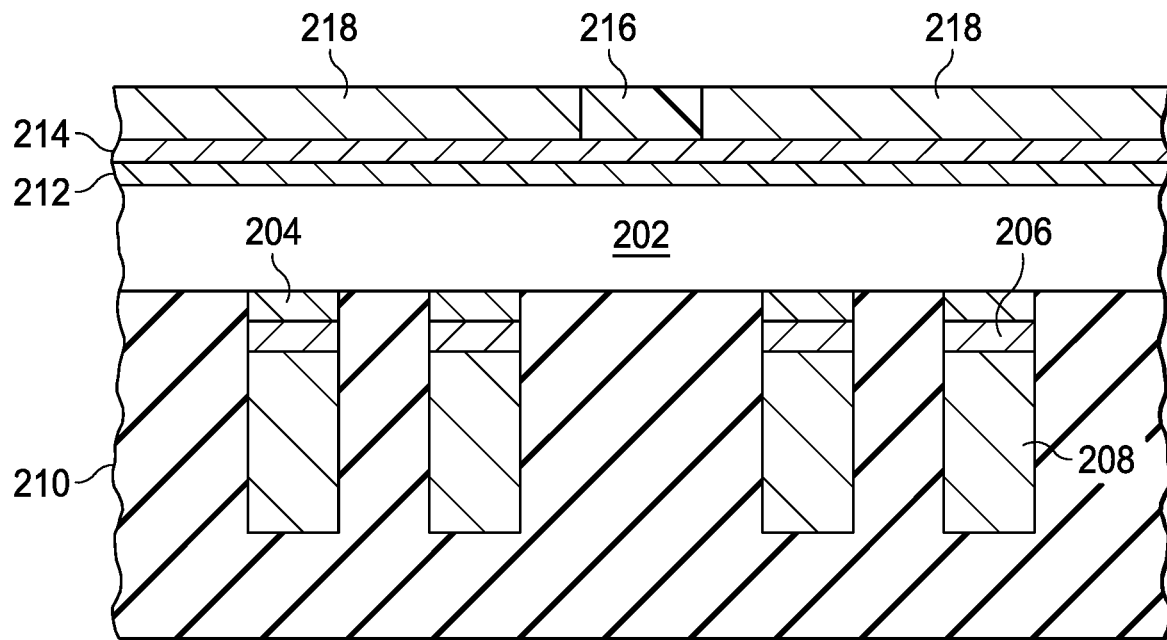

Step 106 is thinning semiconductor wafer 202 as shown in FIG. 2C. The thinned semiconductor wafer 202 is 150μ thick, for example. In FIG. 2C, the assembly is inverted so that the backside is up. The "backside" is the opposite side of the semiconductor wafer from the active side. Step 108 is depositing a titanium-tungsten (TIW) layer 212 (FIG. 2D) as a diffusion barrier layer using sputtering, physical vapor deposition (PVD) or chemical vapor deposition (CVD) or another suitable deposition process to a thickness of 50 to 600 nm. A "diffusion barrier layer" is a layer to prevent intermixing of materials. In this case, TiW layer 212 prevents migration of copper into semiconductor wafer 202. Copper seed layer 214 is formed on TiW layer 212 using sputtering, physical vapor deposition (PVD) or chemical vapor deposition (CVD) or other suitable deposition process to a thickness of 50 to 600 nm.

Step 110 is forming a patterned layer such as photolithographic layer 216 (FIG. 2E) over the interstices or "streets" between dies when the semiconductor wafer is subsequently diced. A semiconductor wafer is "diced" when it is cut into singulated semiconductor devices or "dies." The singulated devices may be integrated circuits or individual active components. Step 112 is forming a conductive layer, such as copper layer 218 (FIG. 2F) on the exposed portions of copper seed layer 214 to a thickness of 50 to 600 nm. Copper layer 218 is formed using a plating process such as electroless plating or electrolytic plating.

Figure 2G:
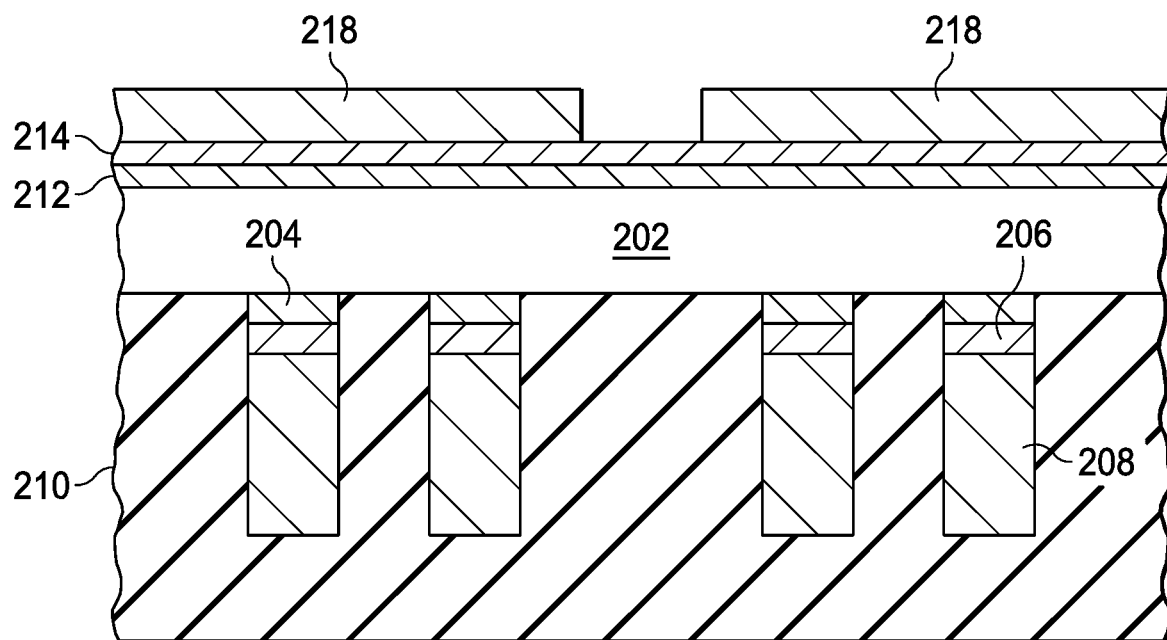
Figure 2H:
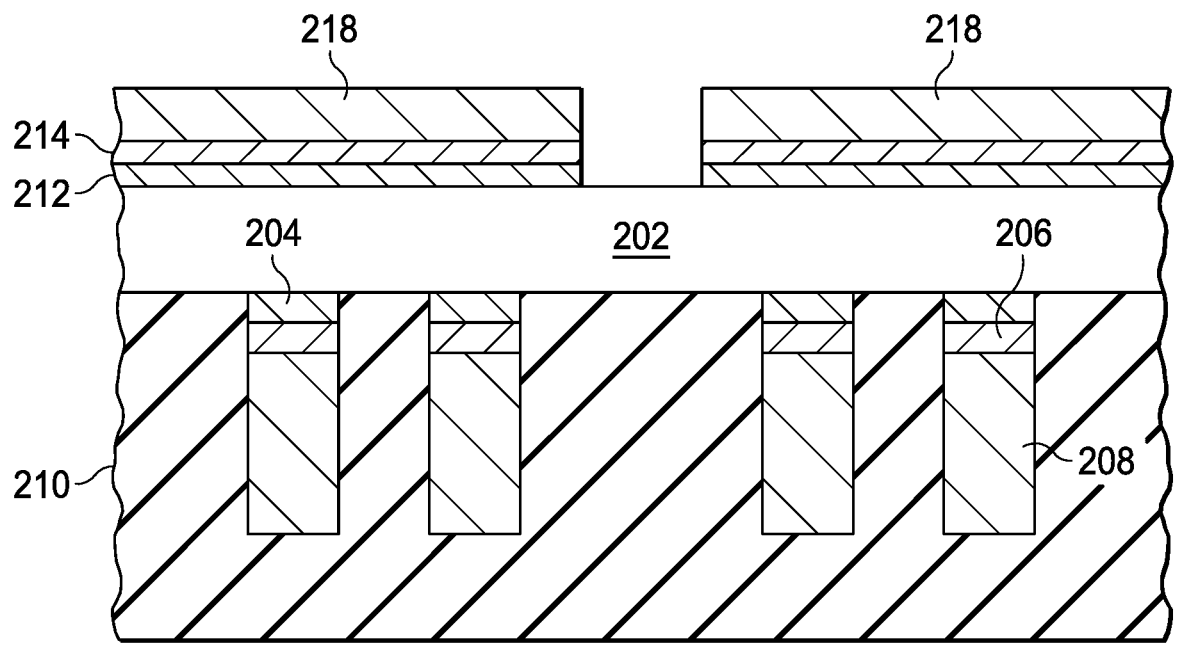
Figure 2I:
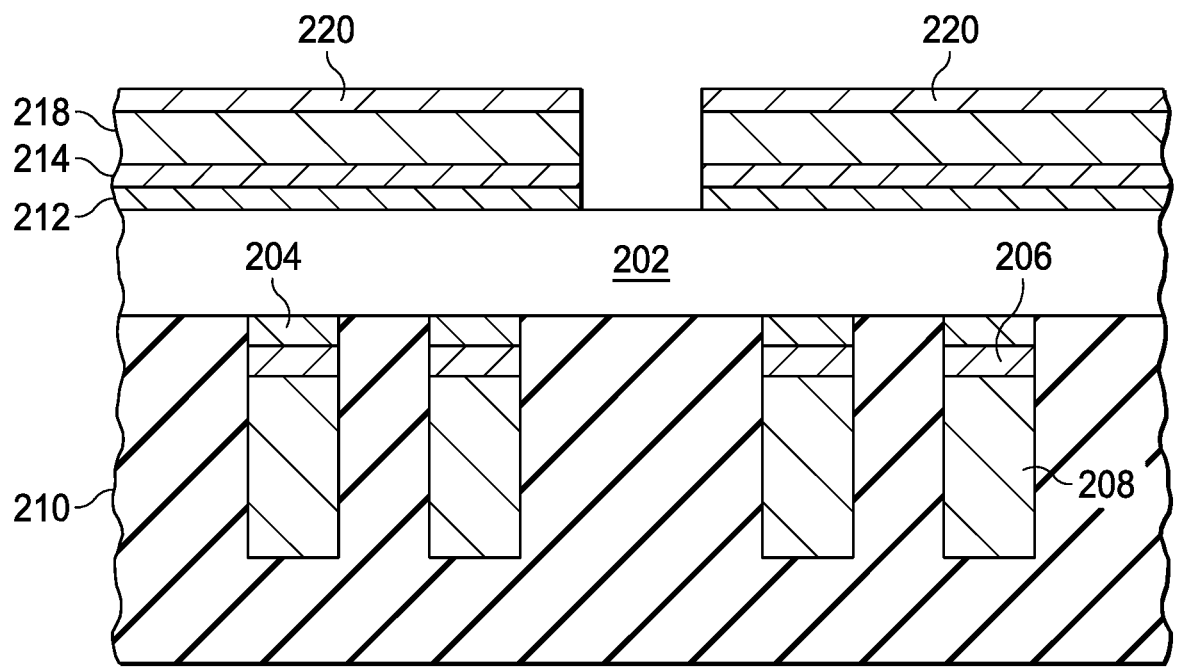
Figure 2J:
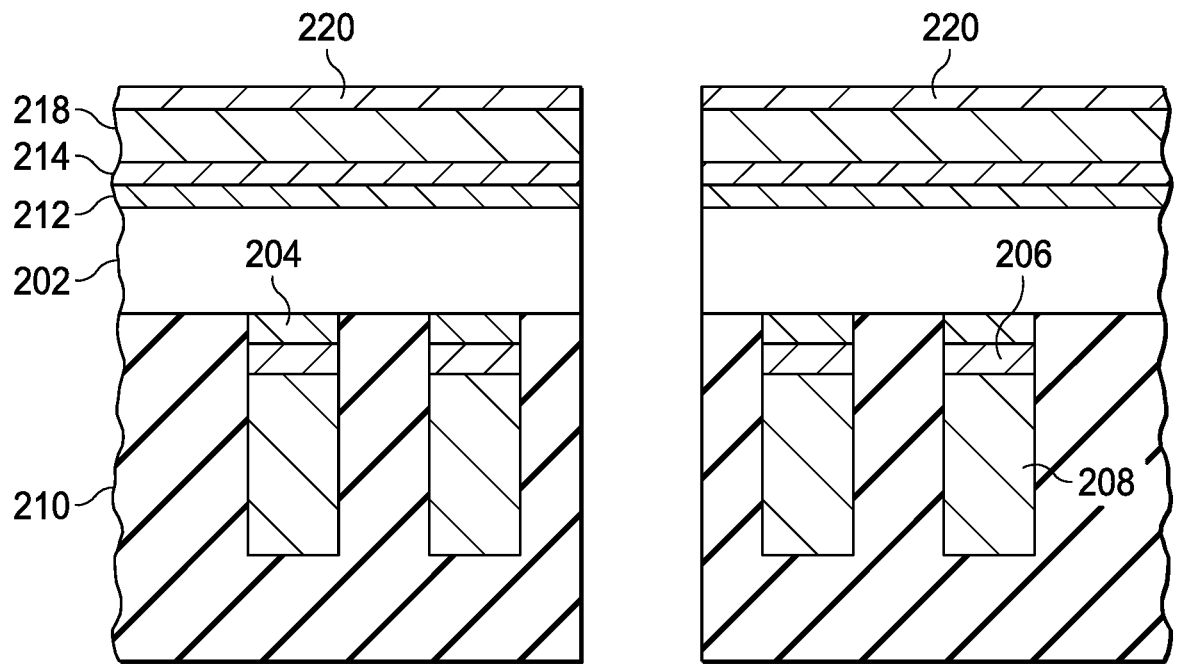
Figure 2K:
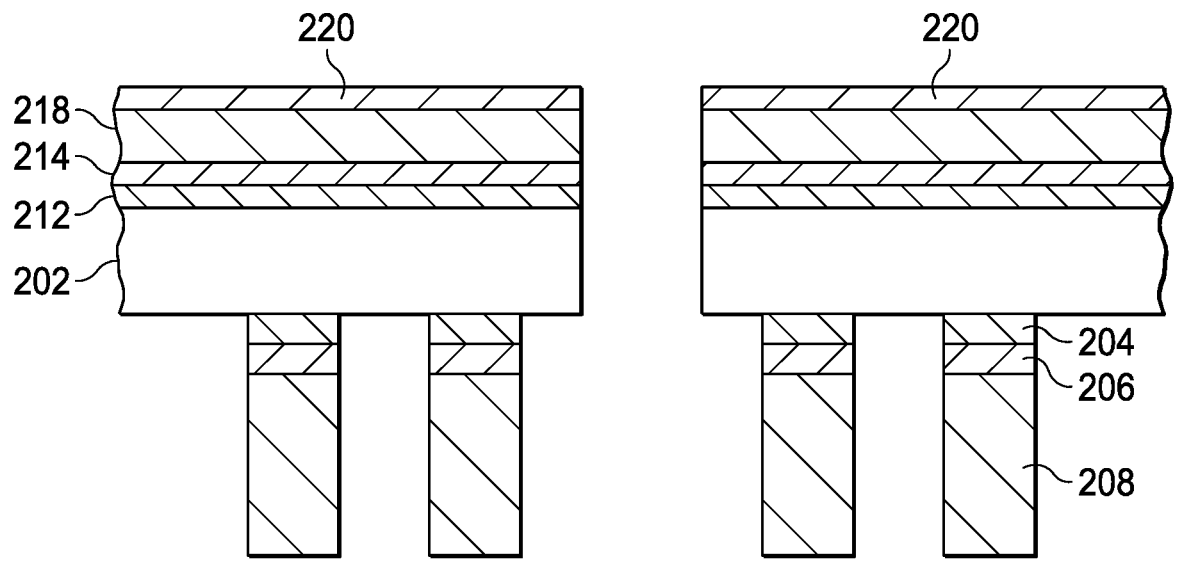

Step 114 is removing photolithographic layer 216 as shown in FIG. 2G. Step 116 is etching copper seed layer 214 and TiW layer 212 using copper layer 218 as a mask as shown in FIG. 2H. These layers are etched chemically using appropriate etchant such as mixture of sulfuric acid and ferric chloride for etching copper seed and hydrogen peroxide for etching TiW. Step 118 is forming a silver layer 220 on copper layer 218 as shown in FIG. 2I. Silver layer 220 is formed using immersion plating to a thickness of 1μ, for example. Immersion plating of silver uses a dissolved salt of silver, such as silver cyanides, silver nitrates and others (See, Török, et al. "Nanoscale characterization of thin immersion silver coatings on copper substrates," Cornell University Library arXiv:1502.01579 [cond-mat.mtrl-sci] (5 Feb. 2015) (available at the uniform resource locator (URL): https://arxiv.org/abs/1502.01579), which is hereby incorporated herein by reference). In addition, the immersion solution can contain chemicals to set pH levels and organic solderability preservatives. Example organic solderability preservatives are discussed in Cole et al., U.S. Pat. No. 5,858,074 issued Jan. 12, 1999, which is hereby incorporated herein by reference. The use of organic solderability preservatives improves solder contacts to silver layer 220, as well as improving other types of connections to silver layer 220, such as silver paste. Step 120 dices the semiconductor wafer 202 into individual dies as shown in FIG. 2J. Step 122 removes the polymer 210 to provide the structure in FIG. 2K, which is ready for packaging. For example, each die may be encapsulated in an encapsulant such as mold compound except for contacts to the pillars and the surface of silver layer 220. In an example configuration, the surface of layer 220 is soldered to a contact to provide rapid thermal transmission from the die, through copper layer 218 and silver layer 220. Thus, the high thermal conductivity of copper and silver provides good thermal management without the cost of gold plating or the complications tin plating (carcinogenic immersion solution, tin whiskers, intermetallic compound formation and others).

Figure 3:
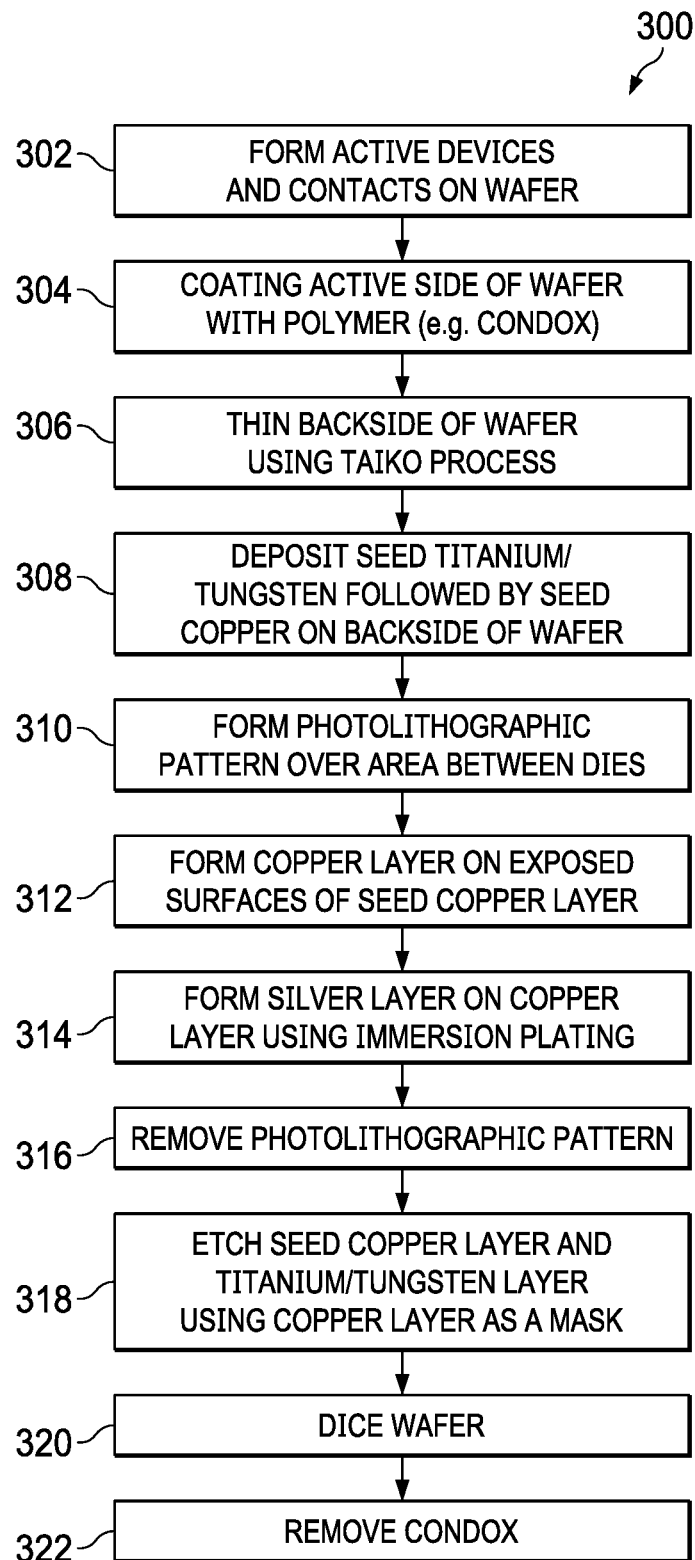
FIG. 3 is a process flow diagram of an example process.
Figure 4A:
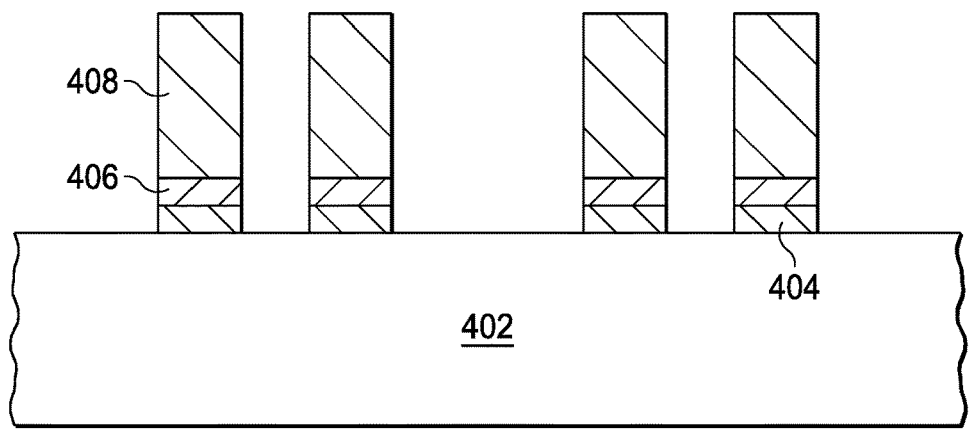
FIGS. 4A-K (collectively "FIG. 4") are schematic diagrams of the process of FIG. 3.
Figure 4B:
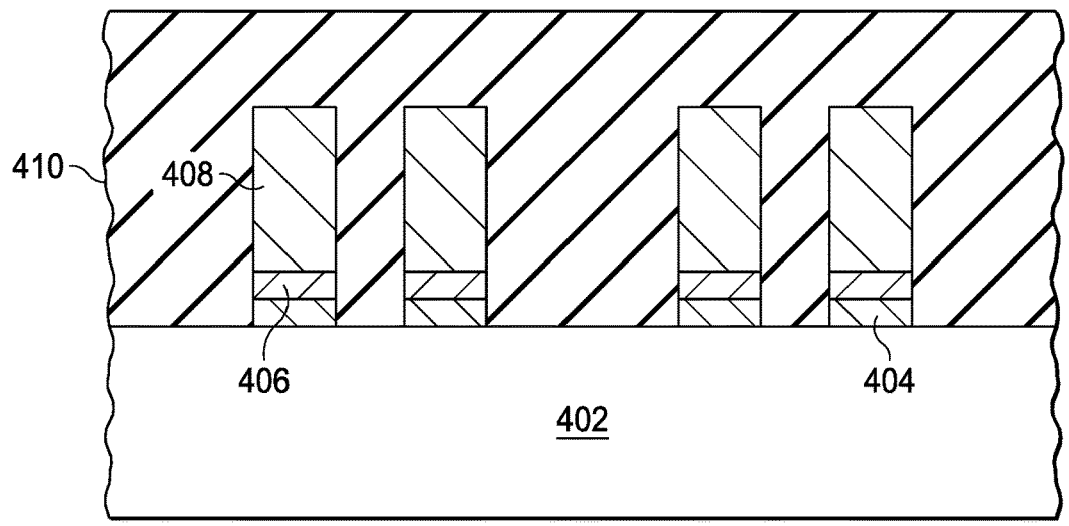
Figure 4C:
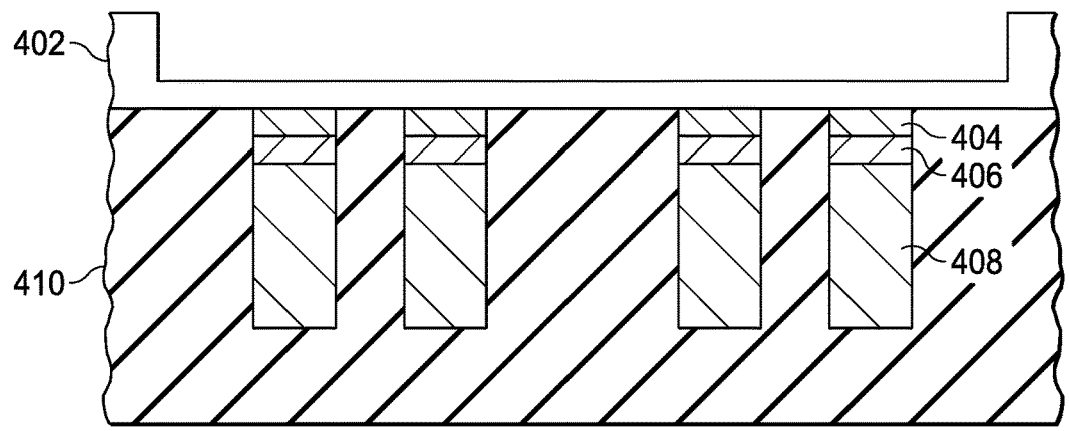
Figure 4D:
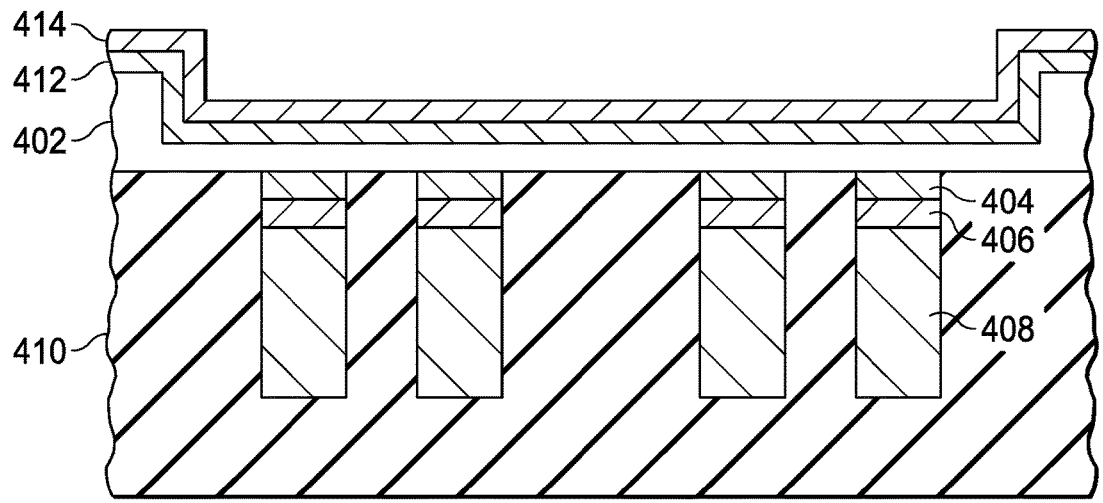

FIG. 3 is a flow diagram of an example process 300 illustrated in FIGS. 4A-K. Step 302 is forming active devices and contacts in a semiconductor wafer 402 (FIG. 4A). In this example, the contacts are pillars that include TiW layer 404, seed copper layer 406 and plated copper layer 408. Step 304 forms a layer of CONDOX 410 by, for example, a spin-on process to cover the active side of semiconductor wafer 402 (FIG. 4B). Step 306 thins the semiconductor wafer 402 (FIG. 4C) using the TAIKO process. DISCO Corporation of Japan developed the TAIKO process, which thins the semiconductor wafer except for a 3 mm rim around the periphery of the semiconductor wafer. The 3 mm rim provides stiffness to the entire semiconductor wafer to avoid problems such as die warpage.

Figure 4E:
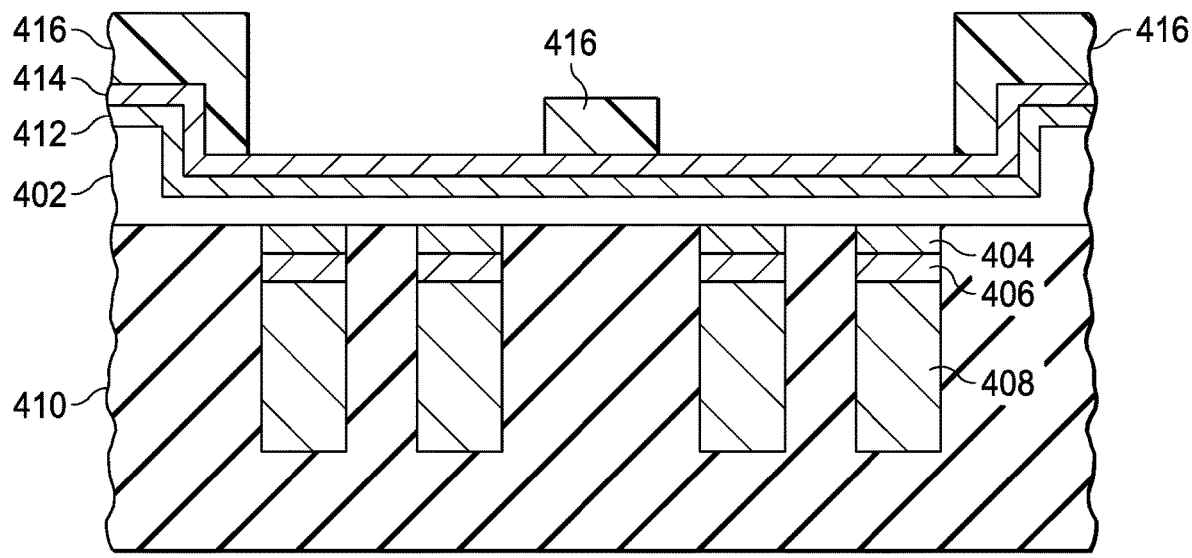
Figure 4F:
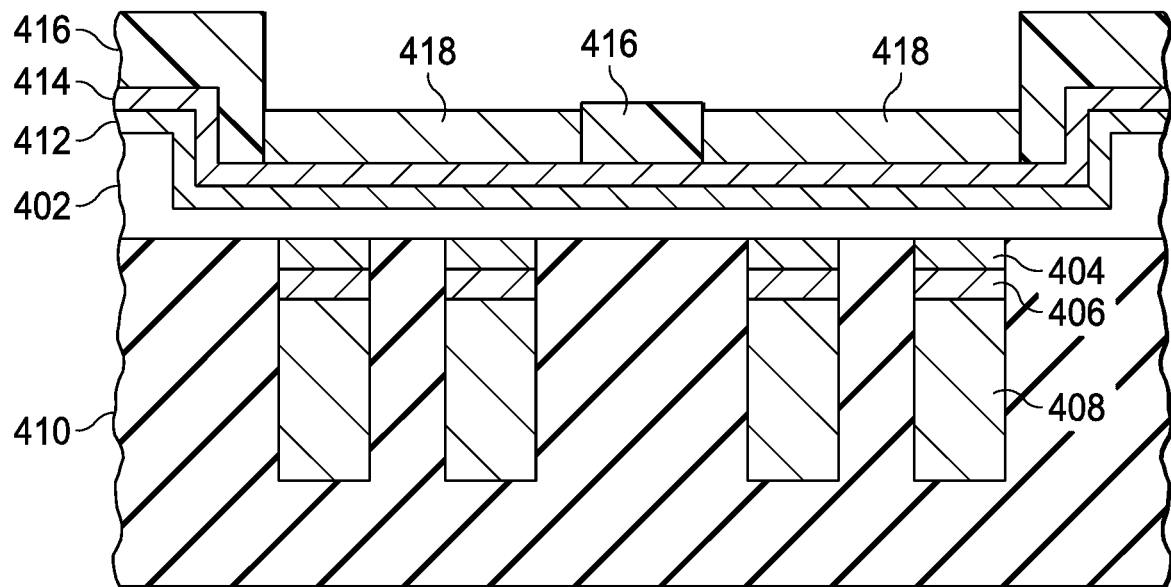
Figure 4G:
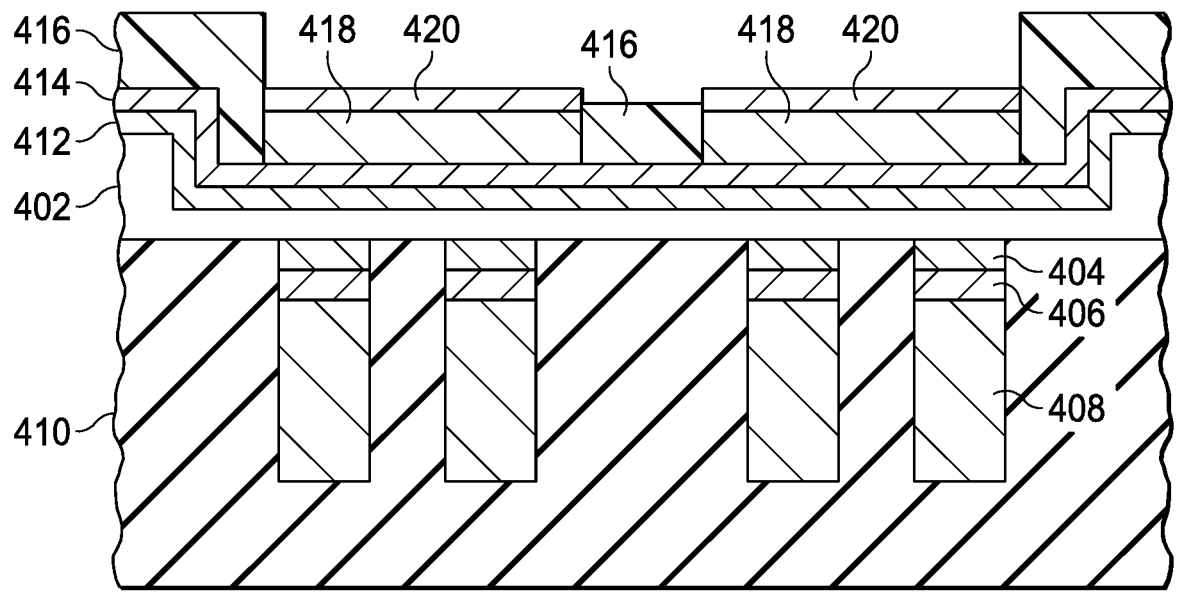

Step 308 is depositing a diffusion barrier layer such as TiW layer 412 on the backside of semiconductor wafer 402 (FIG. 4D) using sputtering, physical vapor deposition (PVD) or chemical vapor deposition (CVD) or another suitable deposition process to a thickness of 50 to 600 nm. A seed copper layer 414 is then formed on TiW layer 412 using sputtering, physical vapor deposition (PVD) or chemical vapor deposition (CVD) or another suitable deposition process to a thickness of 50 to 600 nm. Step 310 forms a patterned layer such as photoresist layer 416 on seed copper layer 414 (FIG. 4E). The openings in photoresist layer in this example are less than the area of each die in semiconductor wafer 402. Thus, the photoresist layer covers the area between dies.

Figure 4H:
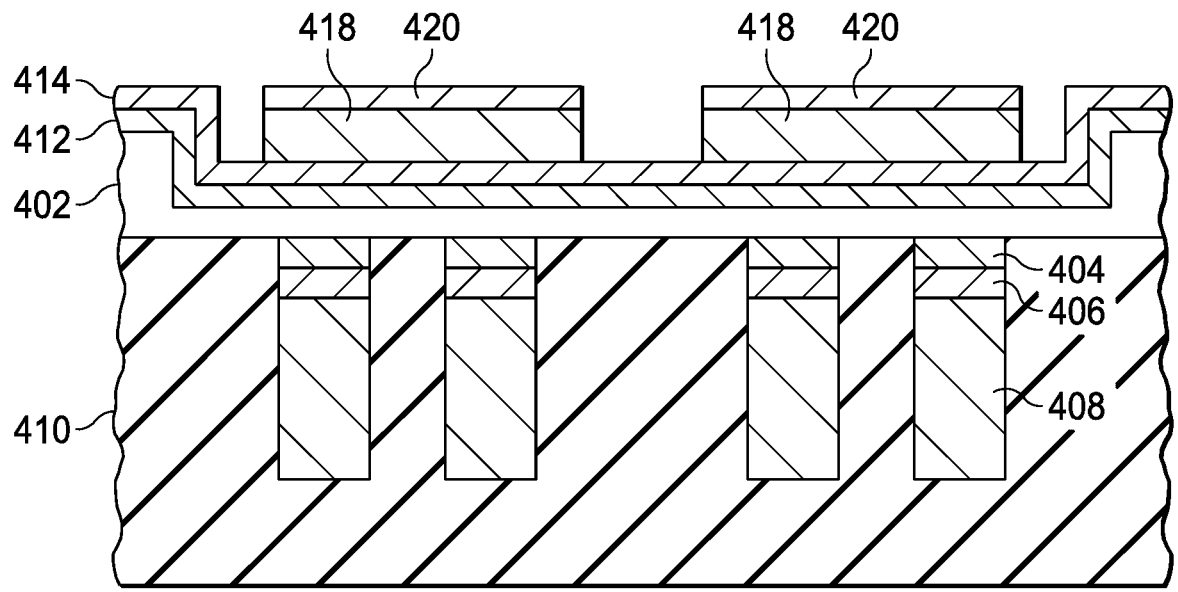
Figure 4I:
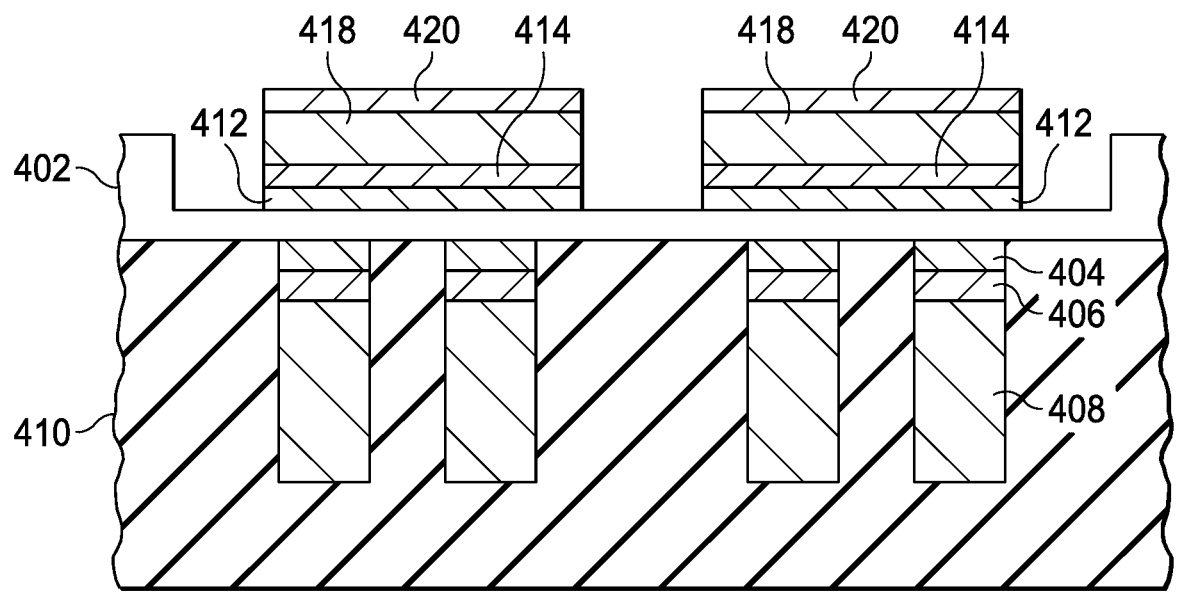

Step 312 is forming conductive layers such as copper layers 418 on the exposed portions of seed copper layer 414 (FIG. 4F) using, for example, electroless or electrolytic plating. Step 314 is forming silver layer 420 on the surface of copper layer 418 (FIG. 4G) using, for example, immersion plating with silver nitrate to a thickness of for example. Other salts of silver may be used in other examples. In addition, the immersion solution may include organic solderability preservatives. Step 316 is removing photoresist layer 416 as shown in FIG. 4H.

Figure 4J:
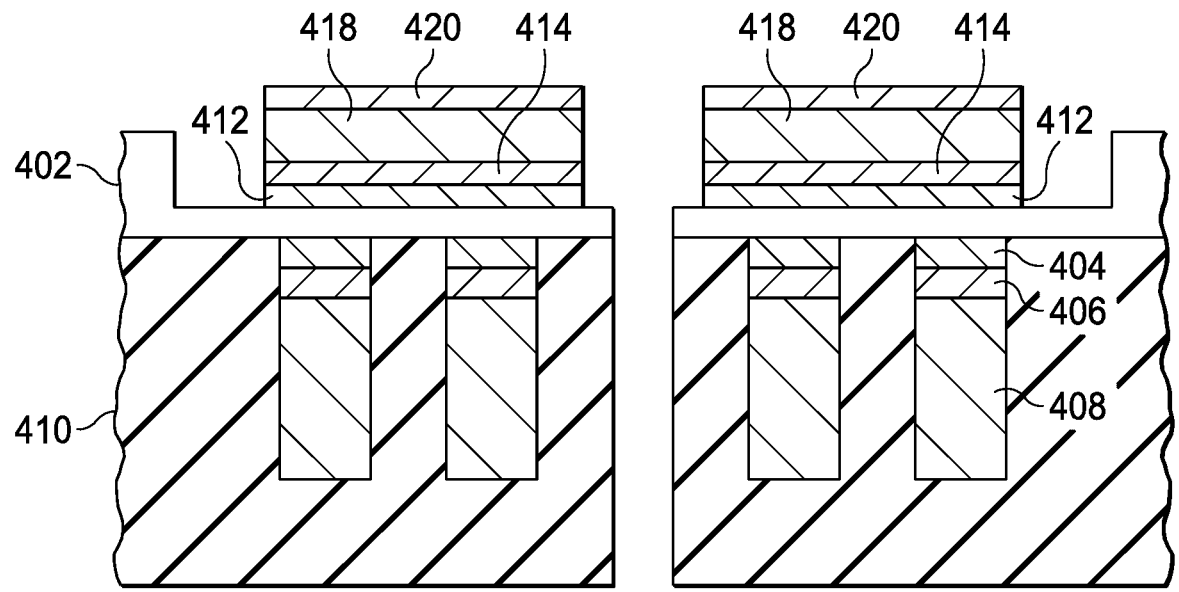
Figure 4K:
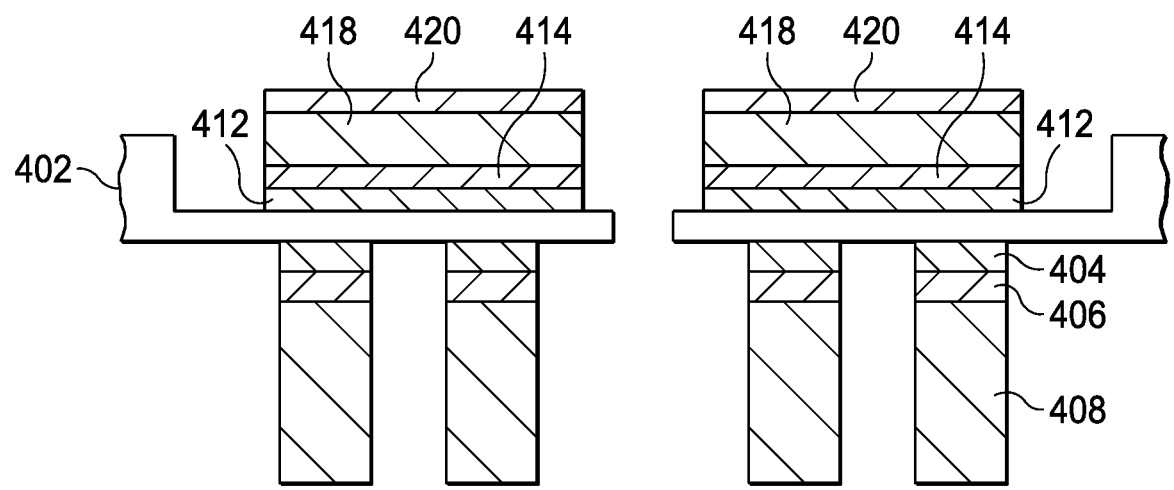

Step 318 etches seed copper layer 414 and TiW layer 412 using copper layer 418 and silver layer 420 (FIG. 4I) as an etch mask. These layers are etched chemically using appropriate etchant such as mixture of sulfuric acid and ferric chloride for etching copper seed and hydrogen peroxide for etching TiW. Step 320 is dicing semiconductor wafer 402 (FIG. 4J). As noted above, the conductive stack including TiW layer 412, seed copper layer 414, copper layer 418 and silver layer 420 are not in the regions between dies or "streets." Step 322 is removing CONDOX 410 as shown in FIG. 4K.

Figure 5:
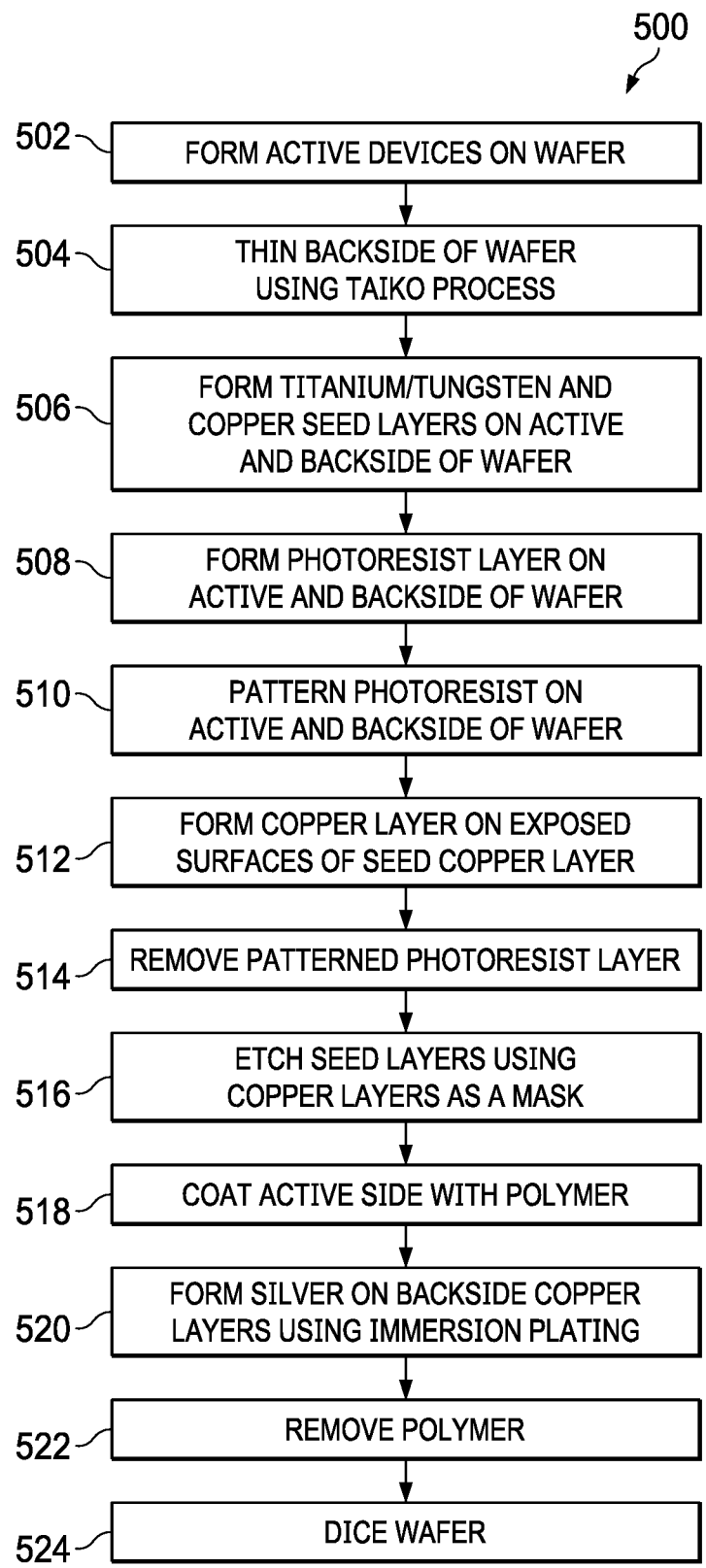
FIG. 5 is a process flow diagram of an example process.
Figure 6A:
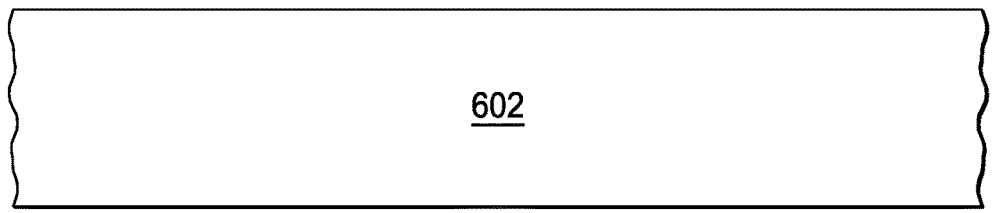
FIGS. 6A-L (collectively "FIG. 6") are schematic diagrams of the process of FIG. 5.
Figure 6B:
Figure 6C:
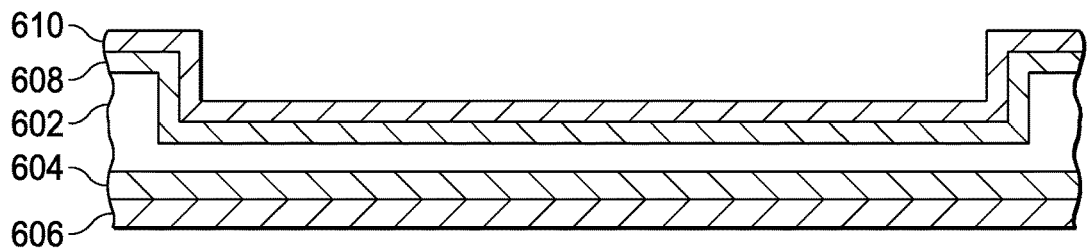
Figure 6D:
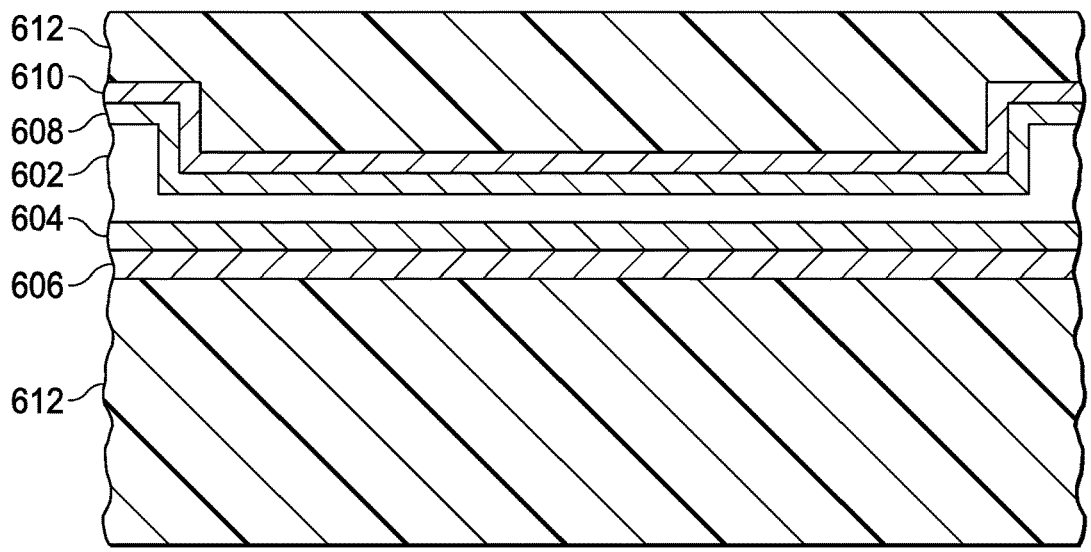

FIG. 5 is a flow diagram of an example process 500 illustrated in FIGS. 6A-L. Step 502 is forming active devices in a semiconductor wafer 602 (FIG. 6A). Step 504 is thinning the backside of semiconductor wafer 602 (FIG. 6B). The backside is the opposite side to the active side, i.e. the side where the active devices are formed. In this example, semiconductor wafer 602 is thinned using the TAIKO process to a thickness of 150μ, for example. Step 506 is forming a TiW layer 604 on the active side of semiconductor wafer 602 and a TiW layer 608 on the backside of semiconductor wafer 602. TiW layers 604 and 608 may be formed separately or simultaneously using sputtering, physical vapor deposition (PVD) or chemical vapor deposition (CVD) or other suitable deposition process to a thickness of 50 to 600 nm. Seed copper layer 606 is formed on TiW layer 604 and seed copper layer 610 is formed on TiW layer 608, either simultaneously or separately, using sputtering, physical vapor deposition (PVD) or chemical vapor deposition (CVD) or another suitable deposition process to a thickness of 50 to 600 nm (FIG. 6C). Step 508 is forming photoresist layer on seed copper layer 606 and seed copper layer 610 as shown in FIG. 6D using, for example, a spin-on process.

Figure 6E:
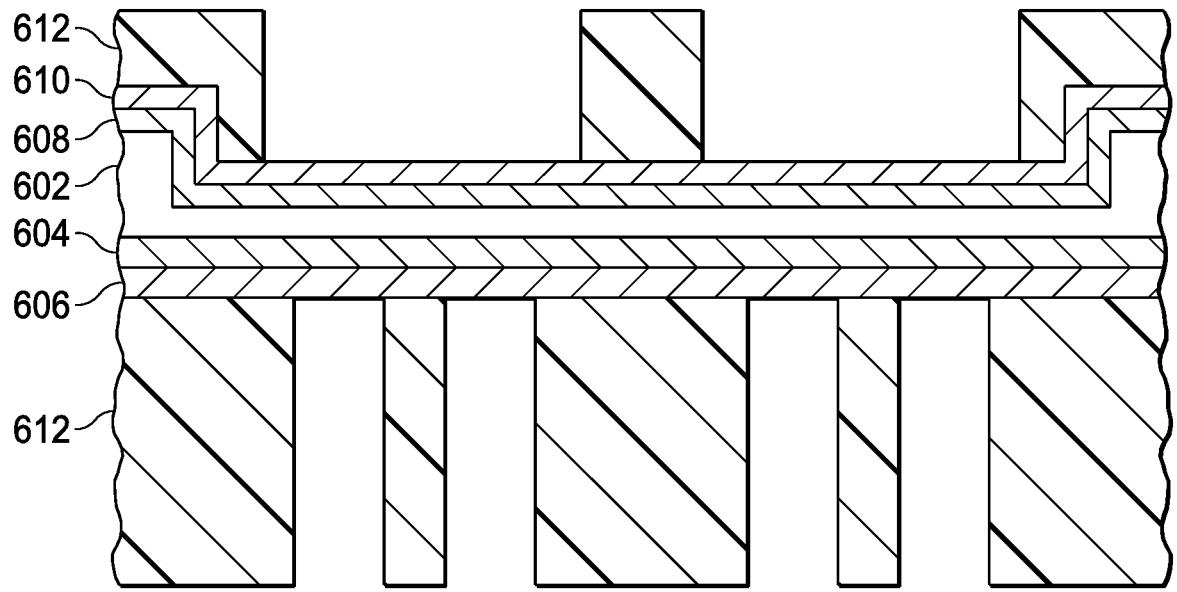
Figure 6F:
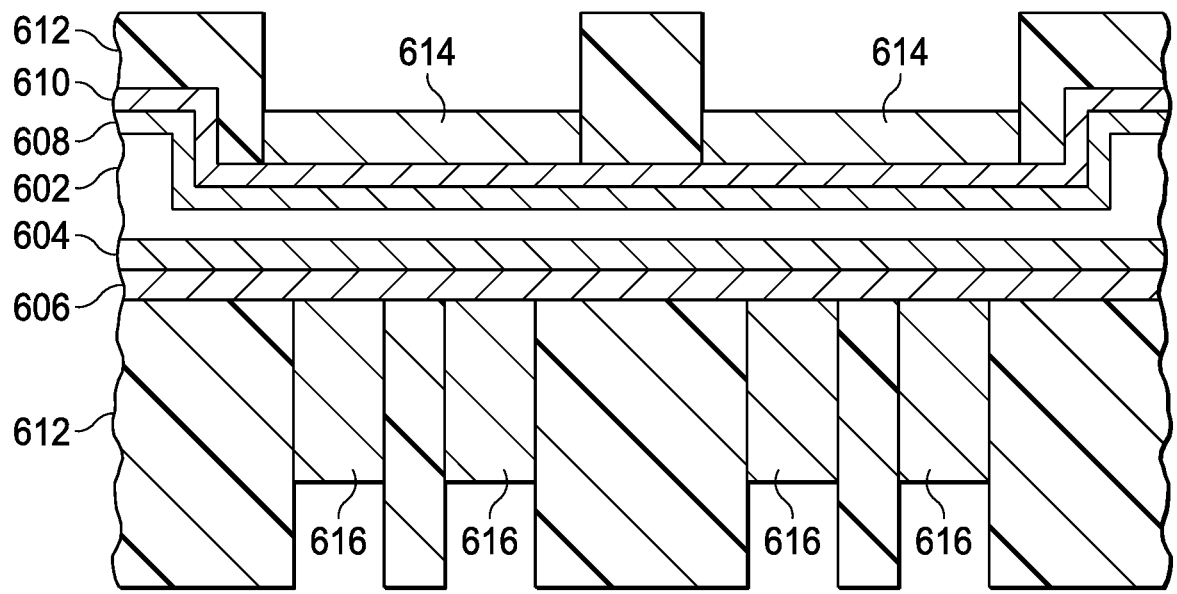
Figure 6G:
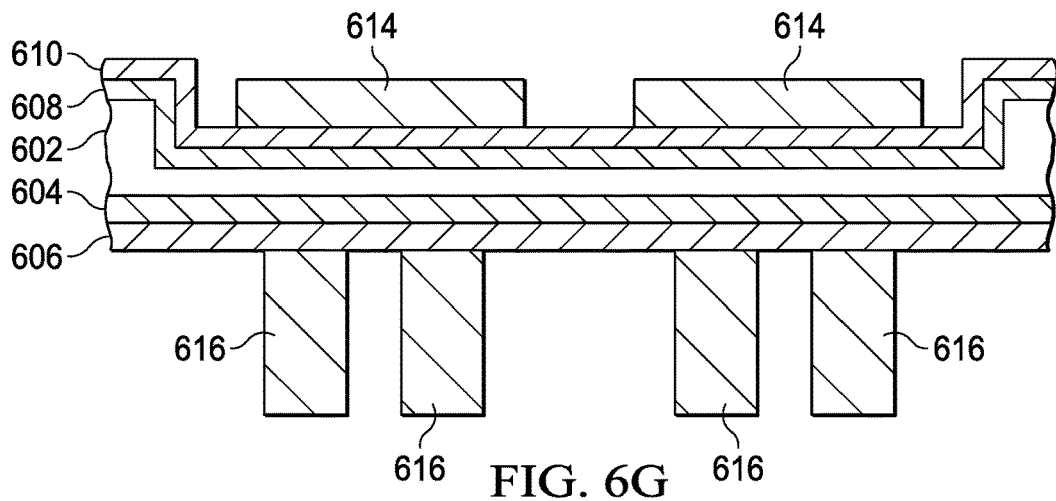
Figure 6H:
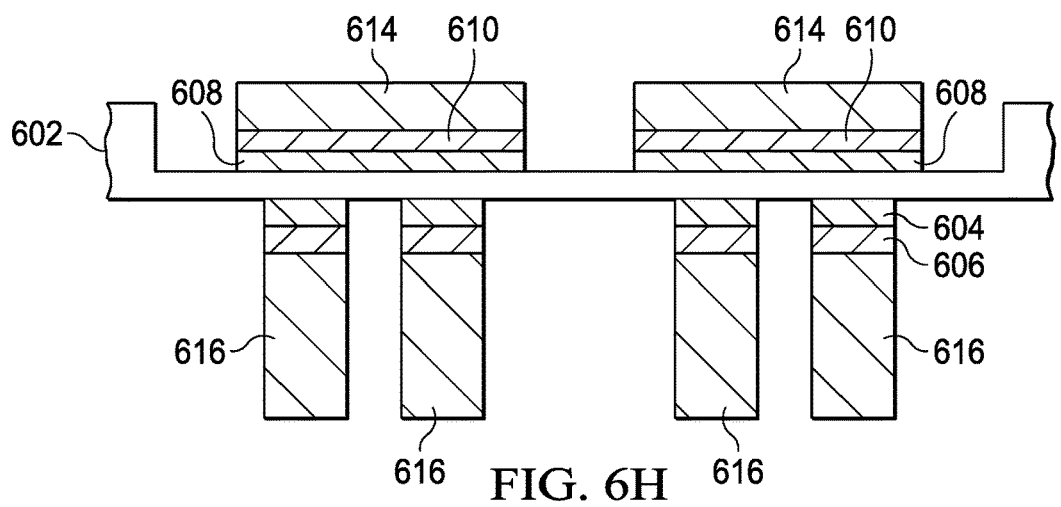

Step 510 is patterning photoresist 612 to provide a patterned layer as shown in FIG. 6E. On the active side of semiconductor wafer 602 over seed copper layer 606, the openings in patterned photoresist correspond to contact points on the semiconductor wafer for contact to the active devices. Step 512 is forming conductive layers such as copper layers 614 and 616 on the exposed portions of seed copper layer 606 and seed copper layer 610 using sputtering, CVD, PVD or another suitable process to a thickness of 50 to 600 nm as shown in FIG. 6F. Step 514 is removing photoresist layer 612 as shown in FIG. 6G. Step 516 is removing the portions of TiW layer 604, seed copper layer 606, TiW layer 608 and seed copper layer 610 that are not covered by copper layers 614 and 616 using, for example, etching chemically using appropriate etchant such as mixture of sulfuric acid and ferric chloride for etching copper seed and hydrogen peroxide for etching TiW as shown in FIG. 6H.

Figure 6I:
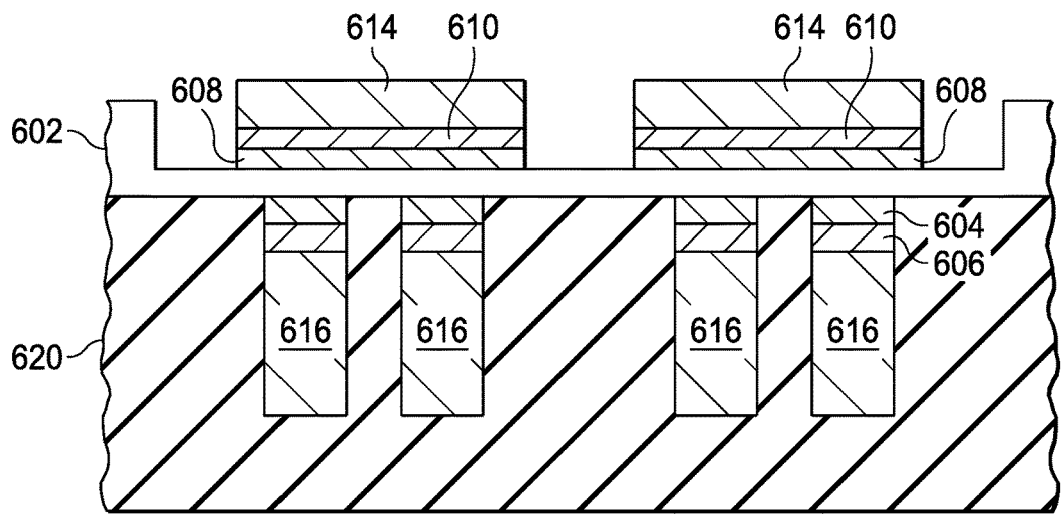
Figure 6J:
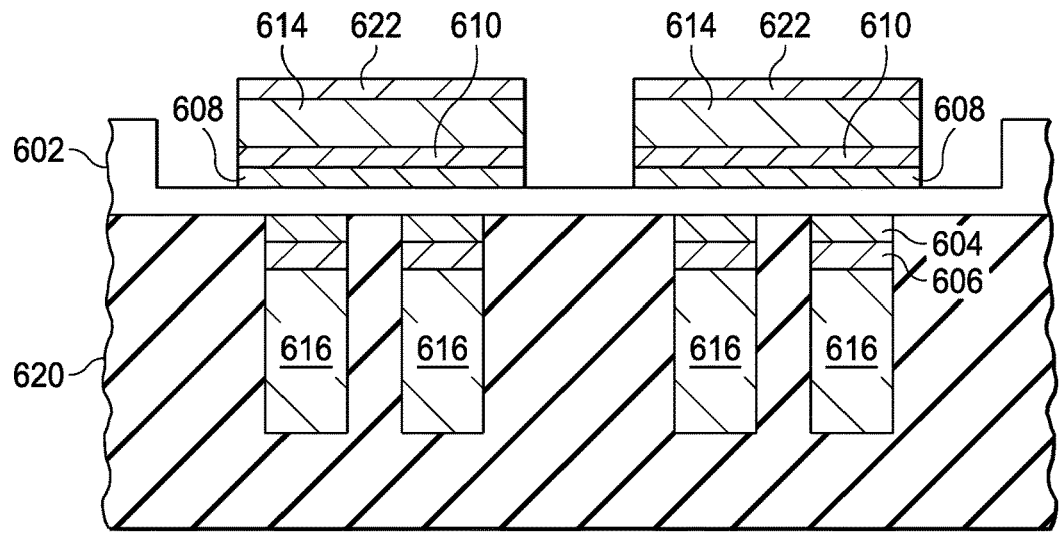
Figure 6K:
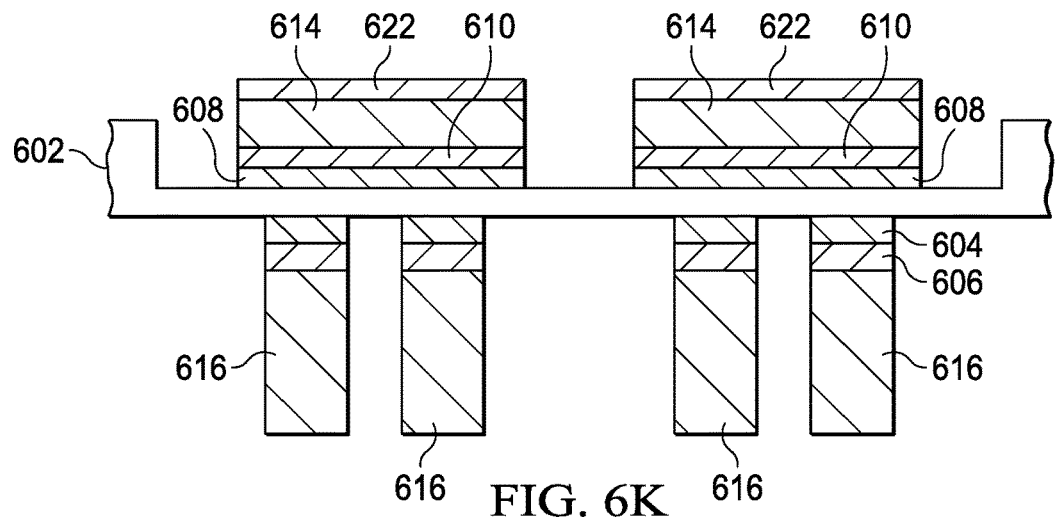
Figure 6L:
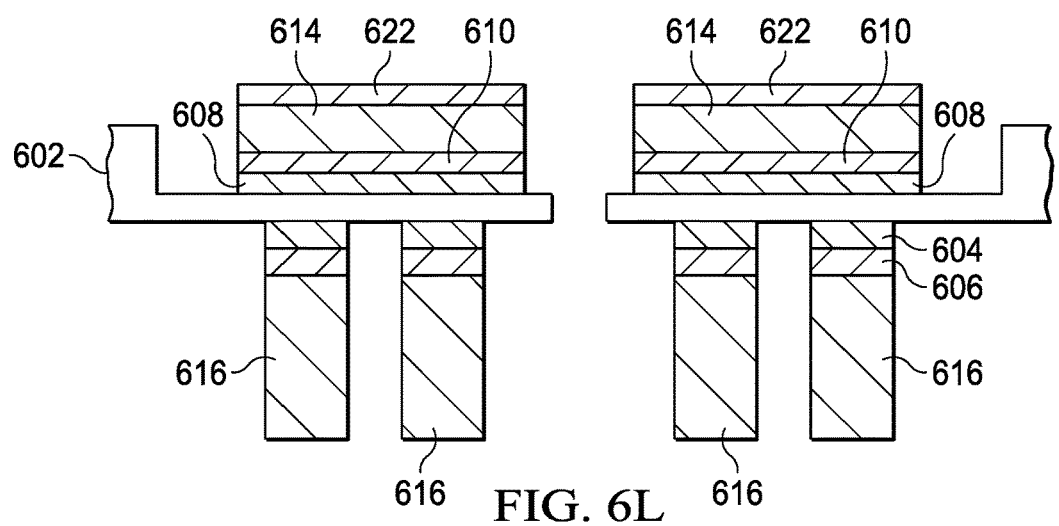

Step 518 is forming a protective polymer layer 620, such as CONDOX, on the active side of semiconductor wafer 602 (FIG. 6I). Step 520 is forming silver layer 622 on copper layer 614 using immersion plating with an organic solderability preservative to a thickness of 1μ, for example (FIG. 6J). Step 522 is removing polymer 620 (FIG. 6K). Step 524 is dicing semiconductor wafer 602 as shown in FIG. 6L.

Figure 7A:
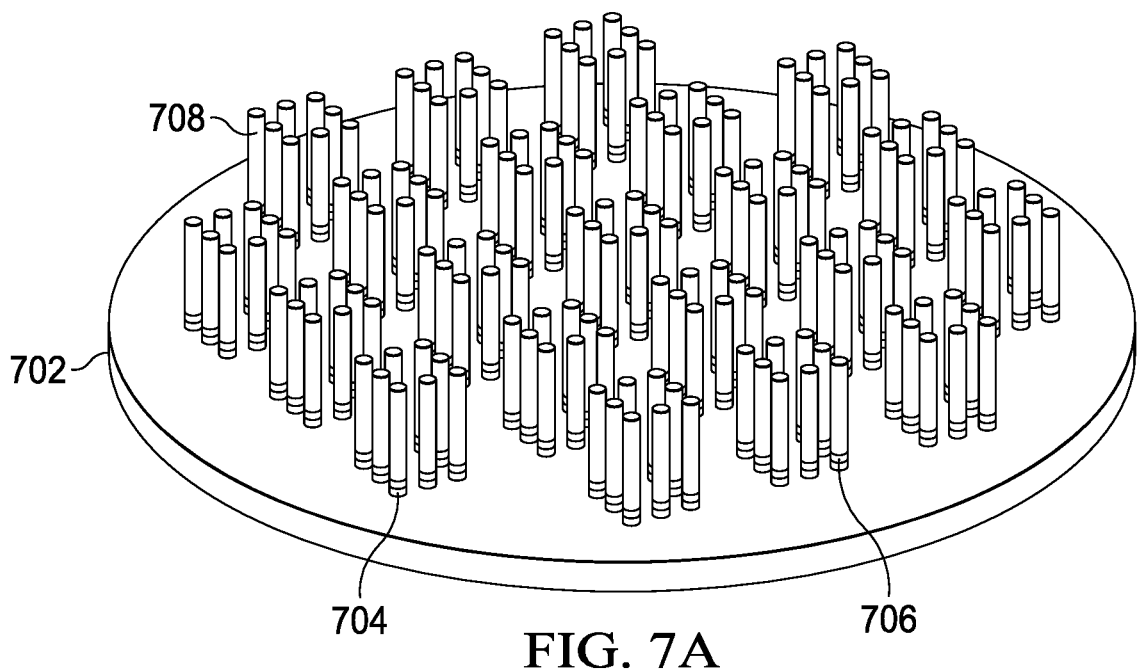
FIGS. 7A-J are perspective diagrams of an example process.
Figure 7B:
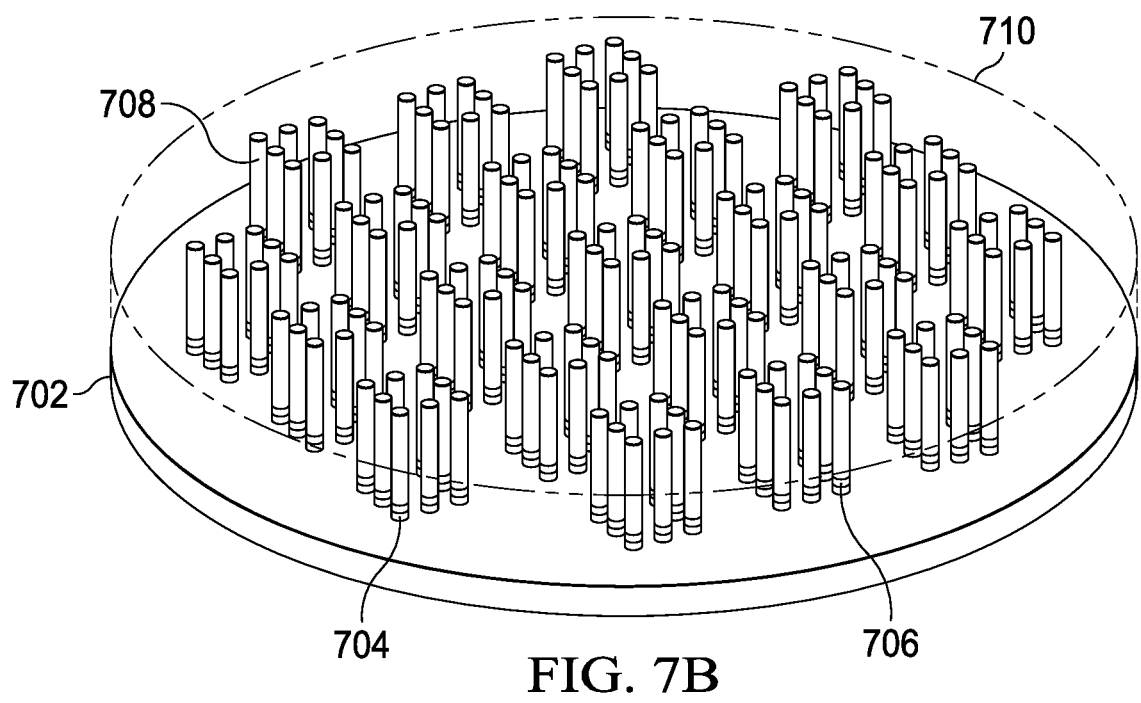
Figure 7C:
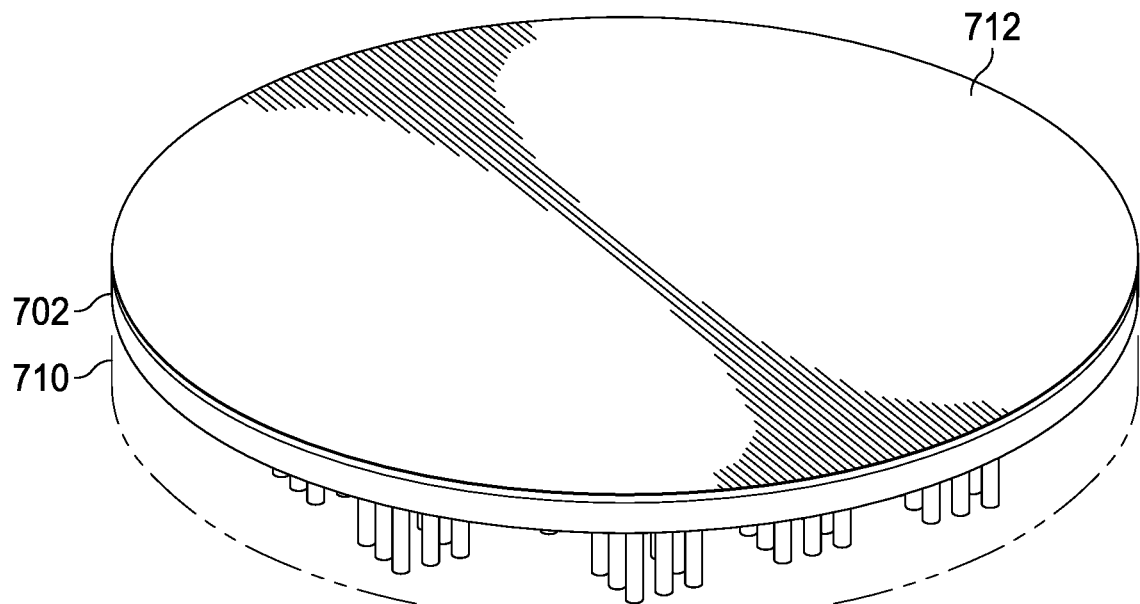
Figure 7D:
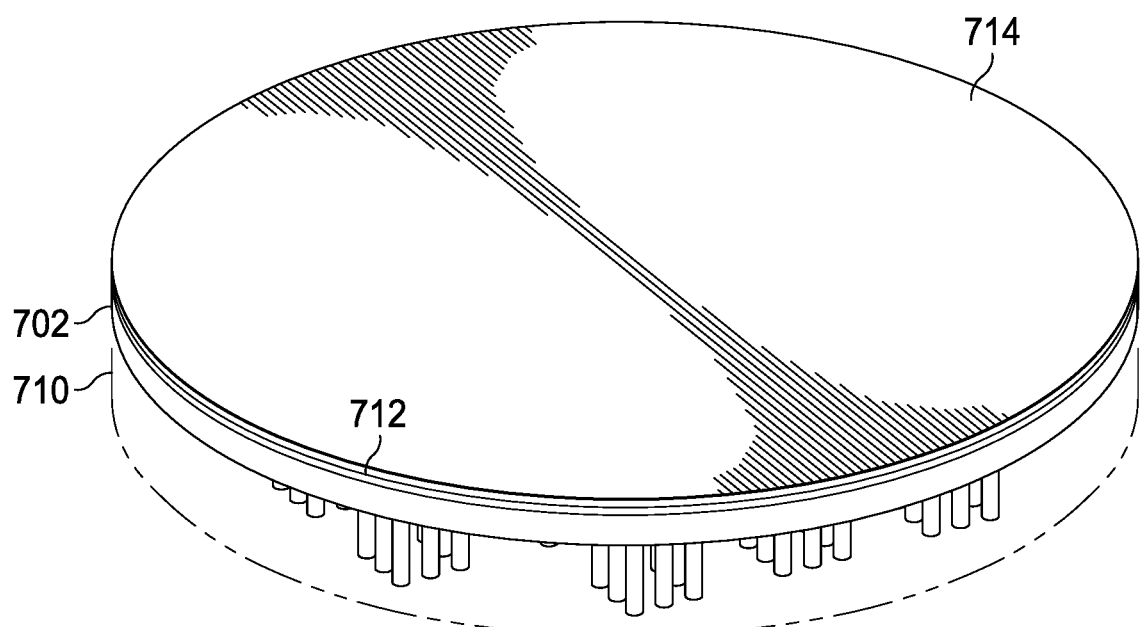

FIGS. 7A-J are perspective diagrams of an example process like process 100 (FIG. 1). FIG. 7A shows the active side of semiconductor wafer 702. Multiple copper bumps on the active side of semiconductor wafer 702 include TiW layer 704, seed copper layer 706 and copper layer 708. Each of these bumps will provide electrical contact to the active circuitry in a particular die on the semiconductor wafer. FIG. 7B shows formation of an adhesive layer 710, such as CONDOX, on the active side of semiconductor wafer 702. In FIG. 7C, semiconductor wafer 702 is inverted from the view of FIGS. 7A and B. The backside of semiconductor wafer 702 is thinned to a thickness of 150μ in this example. TiW layer 712 is deposited on the backside of semiconductor wafer 702 to a thickness of 50 to 600 nm, for example, using sputtering, PVD, CVD or another suitable method. FIG. 7D shows copper seed layer 714, which is deposited to a thickness of 50 to 600 nm, for example, using sputtering, PVD, CVD or another suitable method.

Figure 7E:
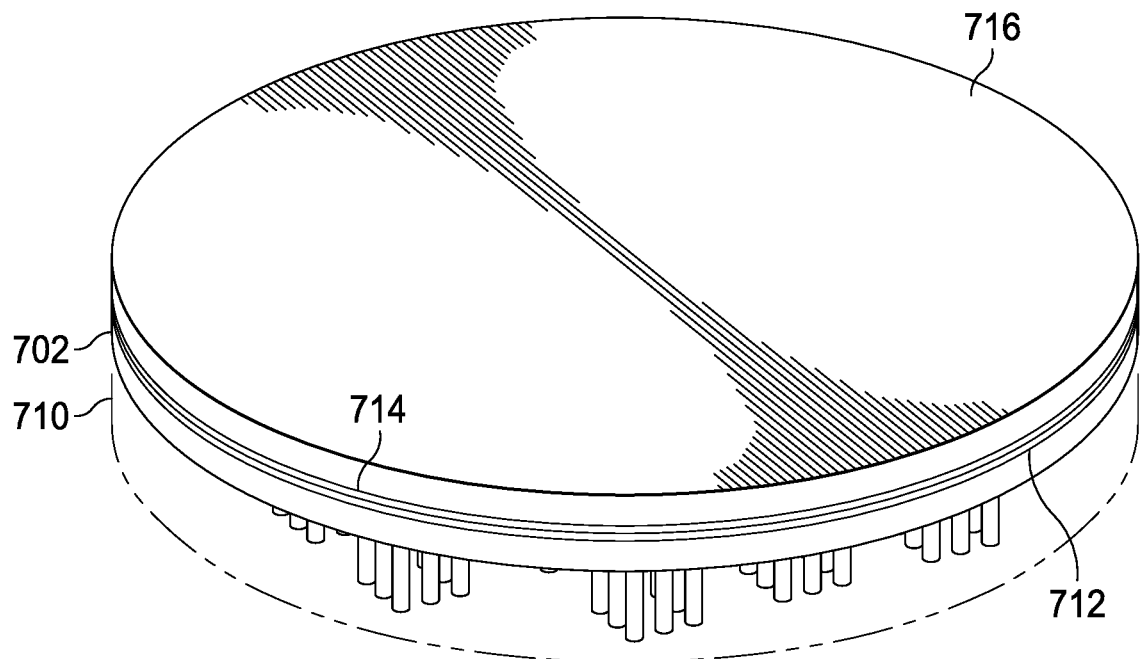
Figure 7F:
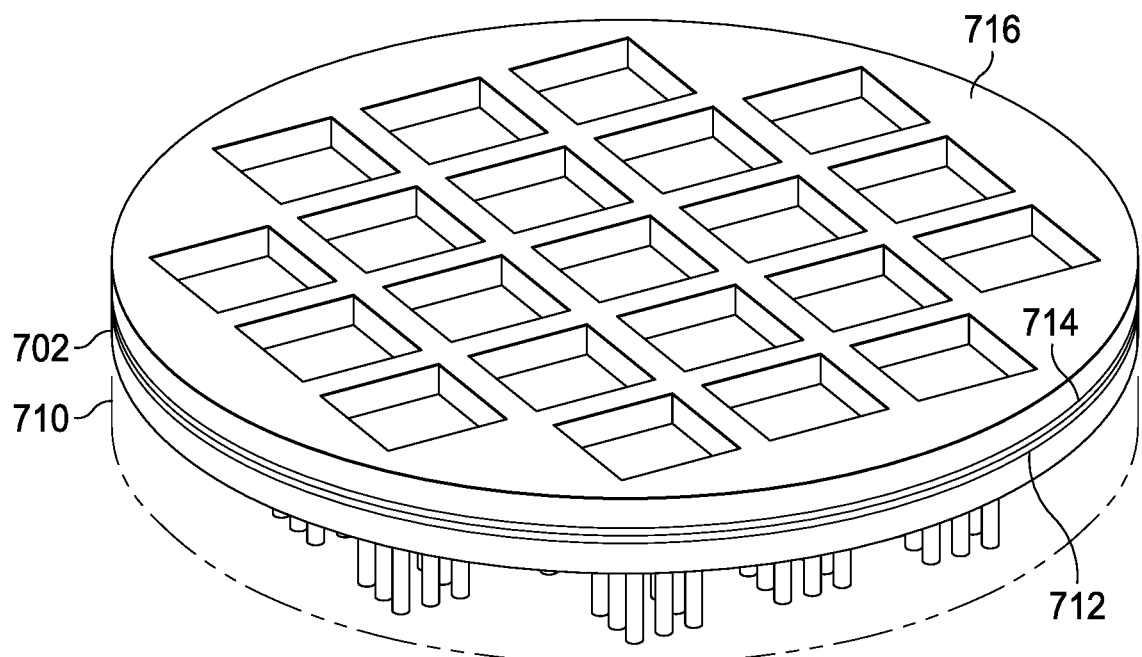
Figure 7G:
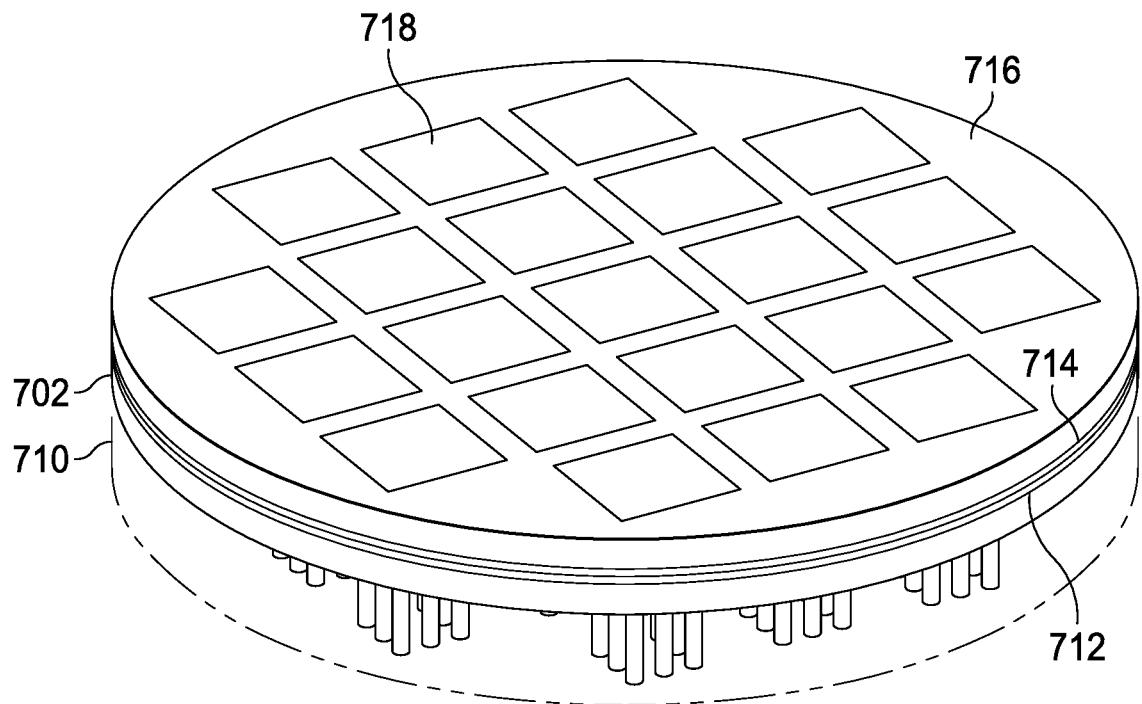
Figure 7H:
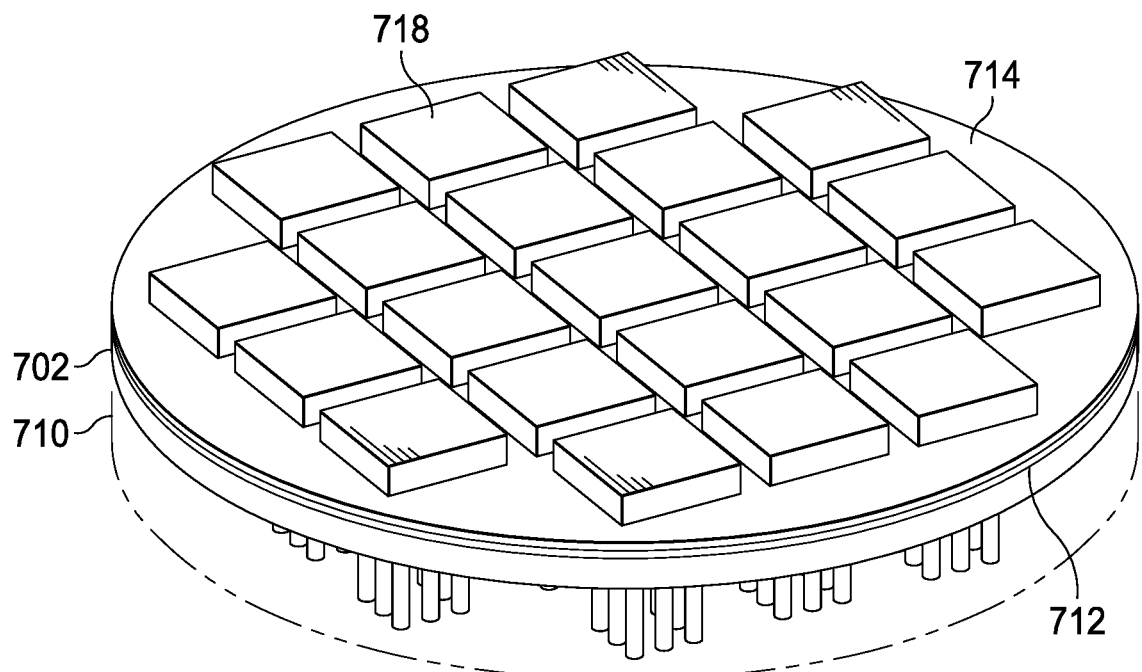
Figure 7I:
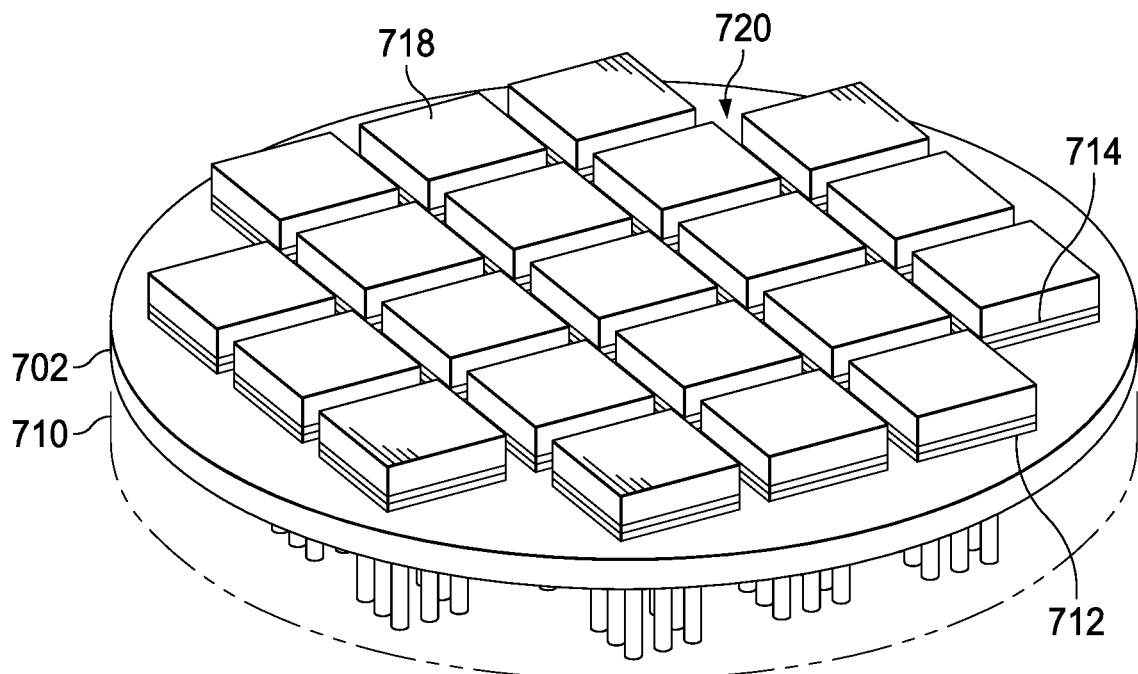
Figure 7J:
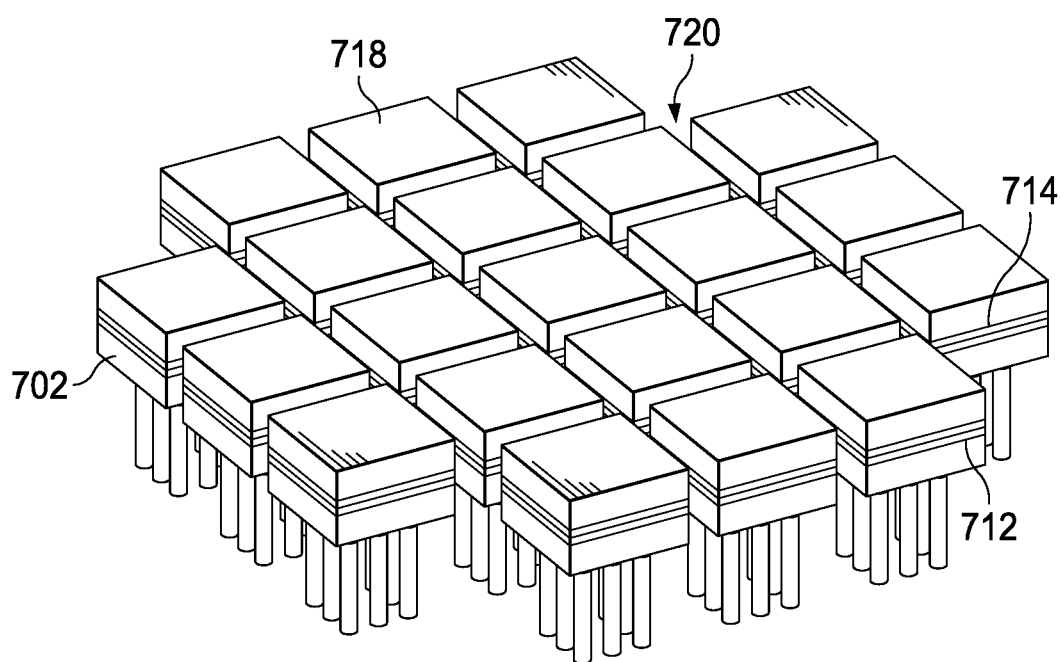

FIG. 7E shows photoresist layer 716, which is spun onto copper seed layer 714. As shown in FIG. 7F, photoresistor layer 716 is patterned to provide a patterned layer including an opening for each die of semiconductor wafer 702. FIG. 7G shows conductive layers such as copper layers 718, which are plated onto the exposed portions of copper seed layer 714 using electroless or electrolytic plating to a thickness of 50 to 600 nm, for example. In an additional example, silver is plated to the surface of copper layers 718 using immersion plating to a thickness of 1μ, for example. FIG. 7H shows the resulting structure after the removal of photoresist layer 716. FIG. 7I shows the removal of the portions of copper seed layer 714 and TiW layer 712 by using chemical etchants and using copper layers 718 as an etch mask. FIG. 7J shows semiconductor wafer 702 diced into separate dies. The singulated dies are then encapsulated using an encapsulant such as mold compound, except to leave copper layers 718 and the bumps on the active side exposed. In one example, the solder balls cover the exposed portion of the bumps to provide a ball grid array.

Figure 8:
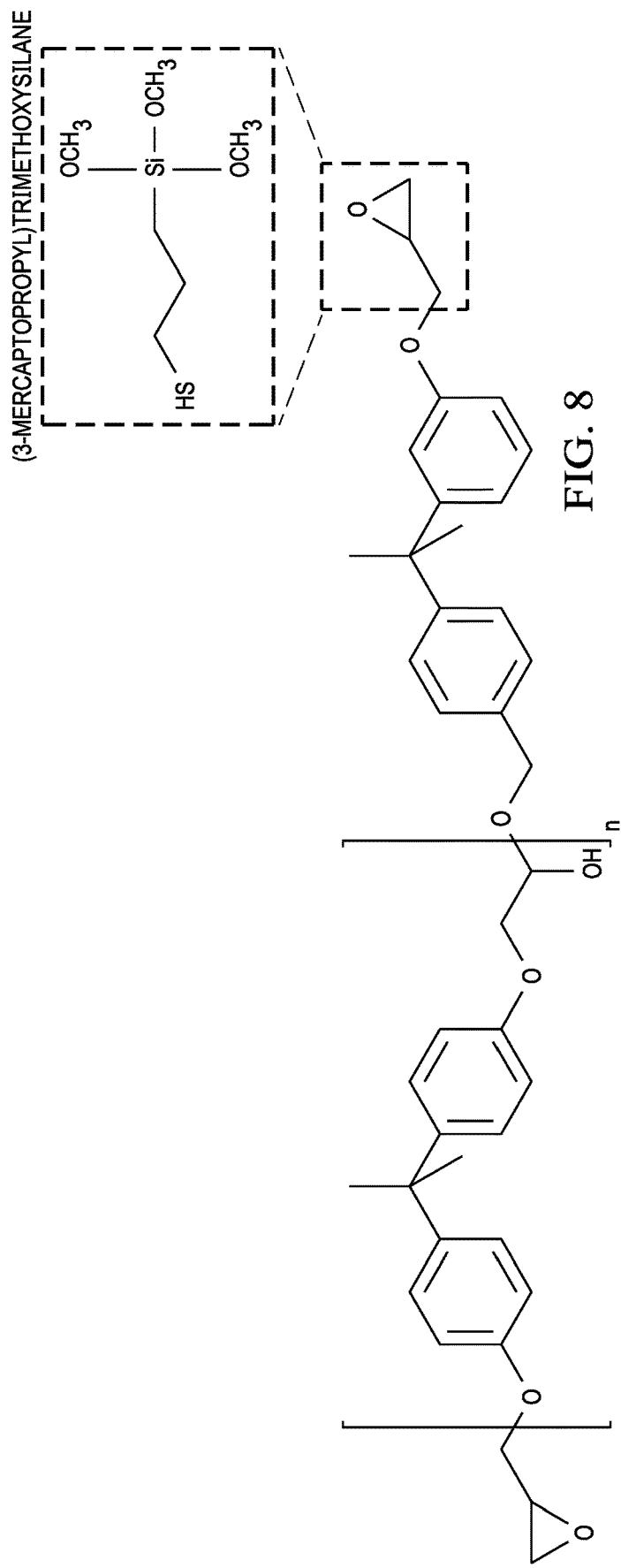
FIG. 8 is a chemical diagram of a compound for an example process.
Figure 9:
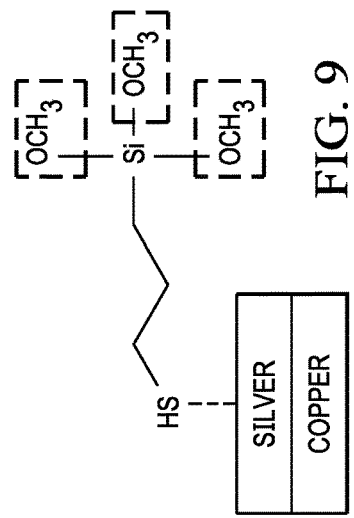
FIG. 9 is another chemical diagram of the compound of FIG. 8.

FIG. 8 is a chemical diagram of one trimethoxysilane radical from (3-mercaptopropyl)trimethoxysilane. The sulfanyl (mercapto) radical (HS) binds the trimethoxysilane radicals to the propyl organic chain as shown in FIG. 9. When dipped in a solution including (3-mercaptopropyl) trimethoxysilane, the sulfanyl radical mediates the bonding of the trimethoxysilane radical to the surface of the metal, such as copper or silver (as shown in FIG. 9). In one example, the solution includes 97% by volume methanol and 3% by volume (3-mercaptopropyl)trimethoxysilane. The trimethoxysilane radicals provide protection to the surface of the metal and mediates binding of conductive epoxies to the metal. The use of (3-mercaptopropyl) trimethoxysilane mitigates delamination issues between the metal and the conductive epoxies and can eliminate delamination issues. Examples of chemicals that may be substituted for (3-mercaptopropyl)trimethoxysilane are (3-Mercaptopropyl)triethoxysilane, which provides triethoxysilane radicals, and (3-Mercaptopropyl)methyldimethoxysilane, which provides methyldimethoxysilane radicals.

Figure 10A:
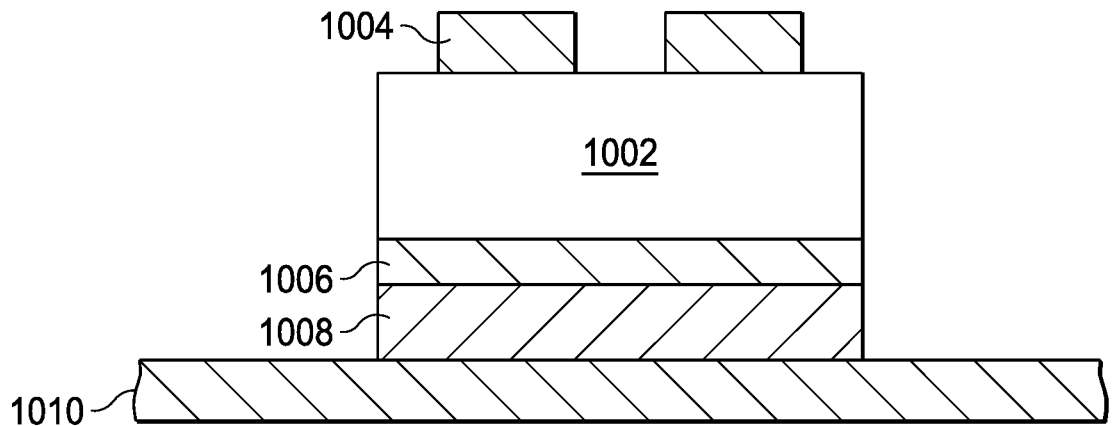
FIGS. 10A-F (collectively "FIG. 10") are schematic diagrams of example structures using a backside copper contact.

FIGS. 10A-F show examples of semiconductor devices using a backside copper contact. FIG. 10A shows a simple mounting of a semiconductor die 1002 having contacts 1004 and backside copper 1006. Backside copper 1006 may or may not include a silver layer formed by immersion. Backside copper 1006 is mounted to copper substrate 1010 using a conductive paste such as silver paste 1008. By preparing backside copper 1006 with (3-mercaptopropyl)trimethoxysilane as described hereinabove, the bond between backside copper 1006 and silver paste 1008 is improved. Also, the use of backside copper 1006 provides good conduction of heat away from semiconductor die 1002 through backside copper 1006, silver paste 1008 and copper substrate 1010, thus enhancing transfer of heat away from semiconductor die 1002.

Figure 10B:
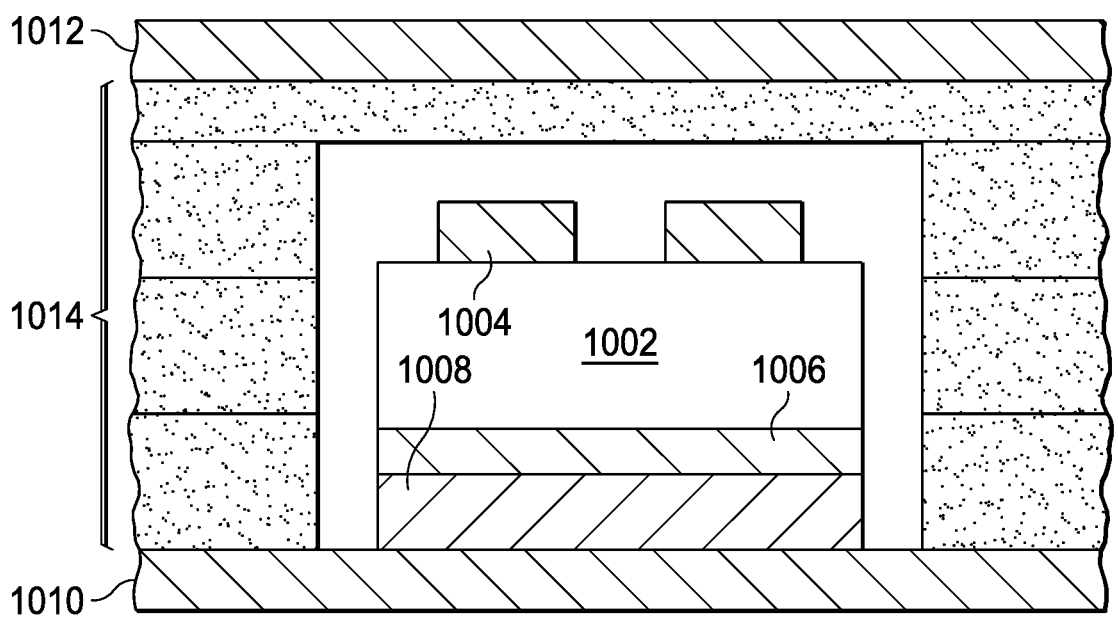

FIG. 10B shows another example configuration. As with the structure of FIG. 10A, semiconductor die 1002 has contacts 1004 and backside copper 1006. Backside copper 1006 may or may not include a silver layer formed by immersion. Backside copper 1006 is mounted to copper substrate 1010 using silver paste 1008. Preparing backside copper 1006 with (3-mercaptopropyl)trimethoxysilane as described hereinabove improves the bond between backside copper 1006 and silver paste 1008. Also, the use of backside copper 1006 provides good conduction of heat away from semiconductor die 1002 through backside copper 1006, silver paste 1008 and copper substrate 1010, thus enhancing transfer of heat away from semiconductor die 1002. In addition to the structure of FIG. 10A, the structure of FIG. 10B includes an active side copper substrate 1012 and encapsulation structure 1014.

Figure 10C:
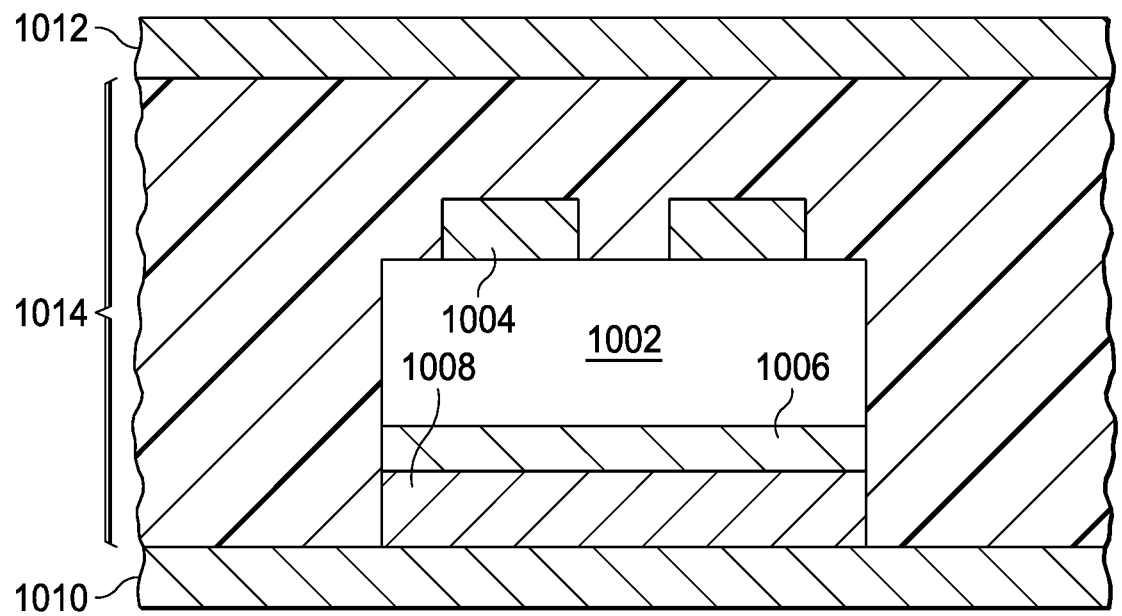
Figure 10D:
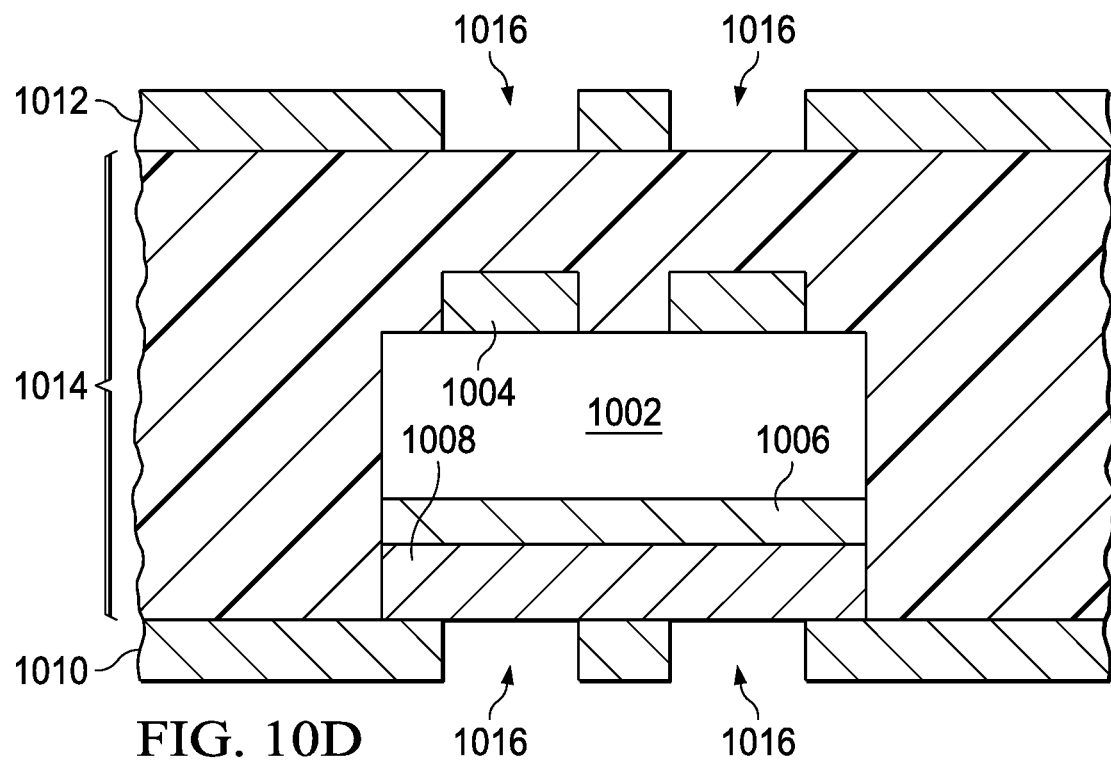
Figure 10E:
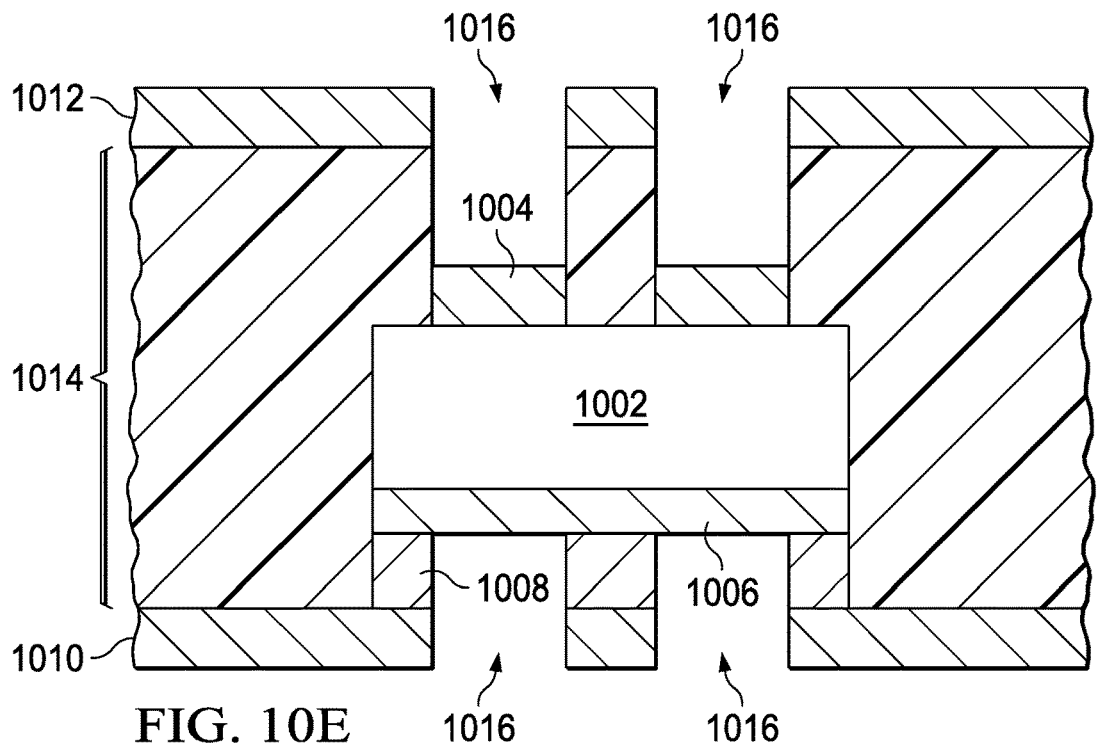
Figure 10F:
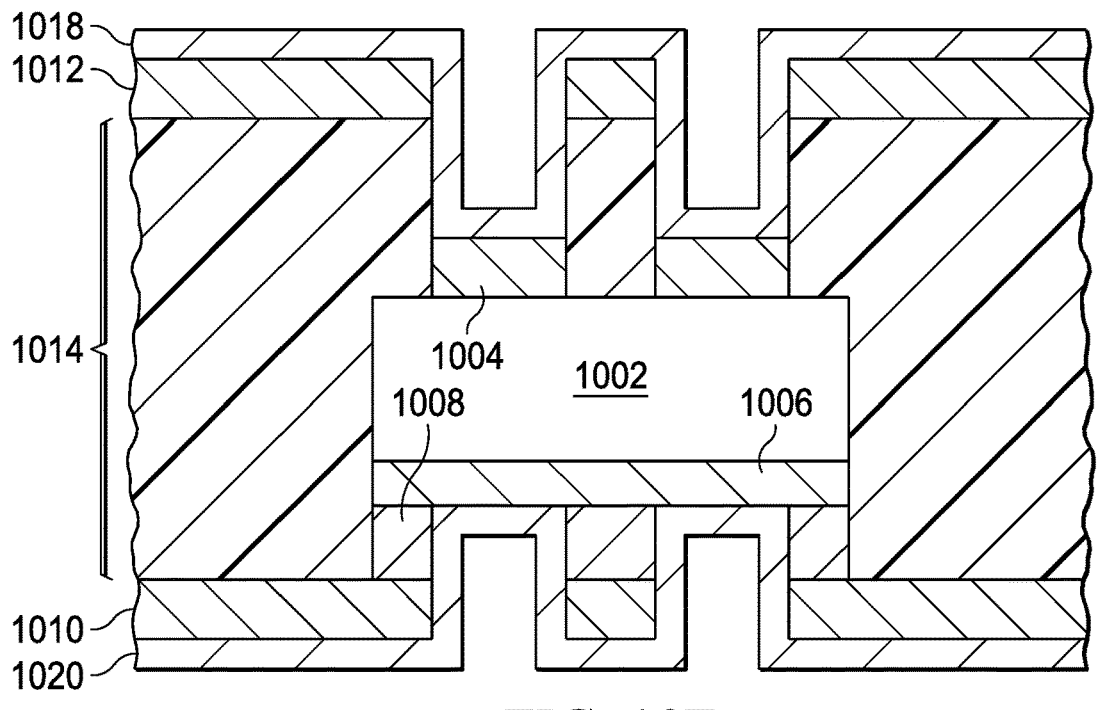

FIG. 10C shows another example configuration. As with the structure of FIG. 10B, semiconductor die 1002 has contacts 1004 and backside copper 1006. In addition, the structure of FIG. 10C includes active side copper substrate 1012 Backside copper 1006 may or may not include a silver layer formed by immersion. Backside copper 1006 is mounted to copper substrate 1010 using silver paste 1008. Preparing backside copper 1006 with (3-mercaptopropyl) trimethoxysilane improves the bond between backside copper 1006 and silver paste 1008. Also, the use of backside copper 1006 provides good conduction of heat away from semiconductor die 1002 through backside copper 1006, silver paste 1008 and copper substrate 1010, thus enhancing transfer of heat away from semiconductor die 1002. In the structure of FIG. 10C, encapsulation structure 1014 is and encapsulant such as mold compound. As shown in FIG. 10D, using patterned etching, openings 1016 are formed in copper substrate 1010 and active side copper substrate 1012. As shown in FIG. 10E, openings 1016 are used as a mask to etch encapsulation structure 1014 and silver paste 1008 to expose contacts 1004 and backside copper 1006. In FIG. 10F, a suitable deposition technique like sputtering forms copper layers 1018 and 1020 on the active side and back side, respectively. Copper layers 1018 and 1020 are then patterned to provide appropriate connections to contacts 1004 and backside copper 1006.

Modifications are possible in the described examples, and other examples are possible, within the scope of the claims.

What is claimed is:

1. A process for making a semiconductor device, comprising:
   forming a first diffusion barrier layer on an active side of a semiconductor wafer;
   forming a second diffusion barrier layer on a backside of the semiconductor wafer;
   forming a first seed copper layer on the first diffusion barrier layer;
   forming a second seed copper layer on the second diffusion barrier layer;
   forming a first copper layer on the first seed copper layer;
   forming a second copper layer on the second seed copper layer; and
   immersion plating a silver layer on the second copper layer.

2. The process of claim 1 in which the second diffusion barrier layer is a titanium-tungsten layer.

3. The process of claim 1 in which the forming of the second seed copper layer includes sputtering the second seed copper layer.

4. The process of claim 1 in which the forming of the second copper layer includes plating the second copper layer.

5. The process of claim 1 further including:
   patterning the second copper layer, the second seed copper layer and the second diffusion barrier layer;
   dicing the semiconductor wafer to form a semiconductor die;
   attaching the semiconductor die to a substrate; and
   molding portions of the semiconductor die and the substrate with a mold compound.

6. The process of claim 1 in which the immersion plated silver layer includes an organic preservative.

7. A process for making a semiconductor device, comprising:
   thinning a backside of a semiconductor wafer, the backside opposite an active side of the semiconductor wafer;
   depositing a titanium-tungsten (TiW) layer on the backside;
   forming a copper seed layer on the TiW layer;
   forming photolithographic pattern over an area between dies on the semiconductor wafer;
   removing some of the photolithographic pattern exposing surfaces of the copper seed layer;
   forming a copper layer on exposed surfaces of the copper seed layer; and
   forming a silver layer on the copper layer using immersion plating.

8. The process of claim 7 in which the titanium-tungsten (TiW) layer is deposited on the backside using sputtering, physical vapor deposition (PVD), or chemical vapor deposition.

9. The process of claim 7 in which the copper layer is deposited on the backside using sputtering, physical vapor deposition (PVD), or chemical vapor deposition.

10. The process of claim 7 in which the silver layer is formed using immersion plating.

11. A process for making a semiconductor device, comprising:
    thinning a backside of a semiconductor wafer, the backside opposite an active side of the semiconductor wafer;
    depositing a titanium-tungsten (TiW) layer on both the active side and the backside of the semiconductor wafer;
    forming a seed copper layer on the TiW layer;
    forming photoresist layers over an area between dies and on the backside of the semiconductor wafer;
    patterning the photoresist layers to expose surfaces of the seed copper layer;
    forming a copper layer on exposed surfaces of the seed copper layer;
    removing the photoresist layer;
    etching the seed copper layer and the TiW layer using the copper layer as a mask; and
    forming a silver layer on the copper layer at the backside of the wafer using immersion plating.

* * * * *